United States Patent
Tamada

(10) Patent No.: US 11,287,501 B1
(45) Date of Patent: Mar. 29, 2022

(54) SYSTEM AND METHOD FOR MULTIPLE CONTRAST ENCODING WITH MAGNETIC RESONANCE IMAGING

(71) Applicant: Wisconsin Alumni Research Foundation, Madison, WI (US)

(72) Inventor: Daiki Tamada, Madison, WI (US)

(73) Assignee: Wisconsin Alumni Research Foundation, Madison, WI (US)

(*) Notice: Subject to any disclaimer, the term of this patent is extended or adjusted under 35 U.S.C. 154(b) by 0 days.

(21) Appl. No.: 17/184,768

(22) Filed: Feb. 25, 2021

(51) Int. Cl.
| | |
|---|---|
| *G01R 33/48* | (2006.01) |
| *G01R 33/32* | (2006.01) |
| *G01R 33/56* | (2006.01) |
| *G01R 33/50* | (2006.01) |
| *G01R 33/58* | (2006.01) |
| *G01R 33/561* | (2006.01) |

(52) U.S. Cl.
CPC ......... *G01R 33/4828* (2013.01); *G01R 33/32* (2013.01); *G01R 33/50* (2013.01); *G01R 33/5608* (2013.01); *G01R 33/5615* (2013.01); *G01R 33/583* (2013.01)

(58) Field of Classification Search
USPC .......................................................... 324/309
See application file for complete search history.

(56) References Cited

U.S. PATENT DOCUMENTS

| | | | | |
|---|---|---|---|---|
| 5,068,610 A | * | 11/1991 | Mehlkopf | G01R 33/50 324/312 |
| 2018/0136300 A1 | * | 5/2018 | De Rochefort | G01R 33/586 |

* cited by examiner

*Primary Examiner* — Rodney E Fuller
(74) *Attorney, Agent, or Firm* — Quarles & Brady LLP

(57) ABSTRACT

A system and method are provided for producing at least one of an image or a map of a subject. The method includes controlling a magnetic resonance imaging system to perform a pulse sequence that includes at least one phase increment of an RF pulse of a gradient echo pulse sequence configured to encode longitudinal relaxation (T1) information in an imaginary component of a magnetic resonance (MR) data received from the subject and encode at least transverse relaxation (T2) information in a real component of the MR data received from the subject. The method also includes generating a T1 image or map of the subject or a T2 image or map of the subject from the MR data and displaying the T1 image or map or the T2 image or map of the subject.

19 Claims, 14 Drawing Sheets

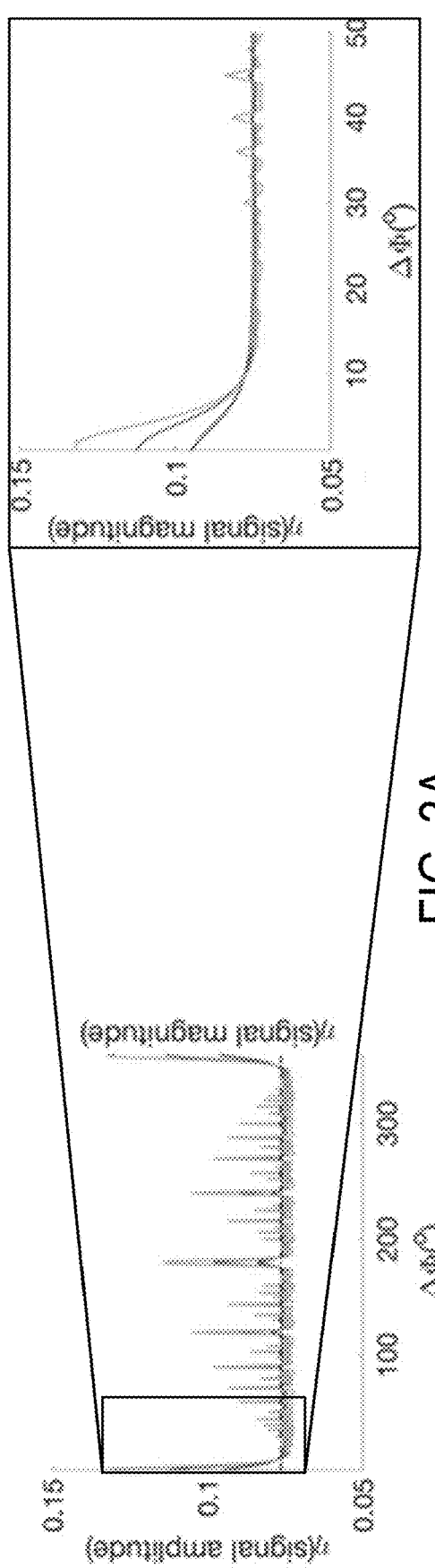
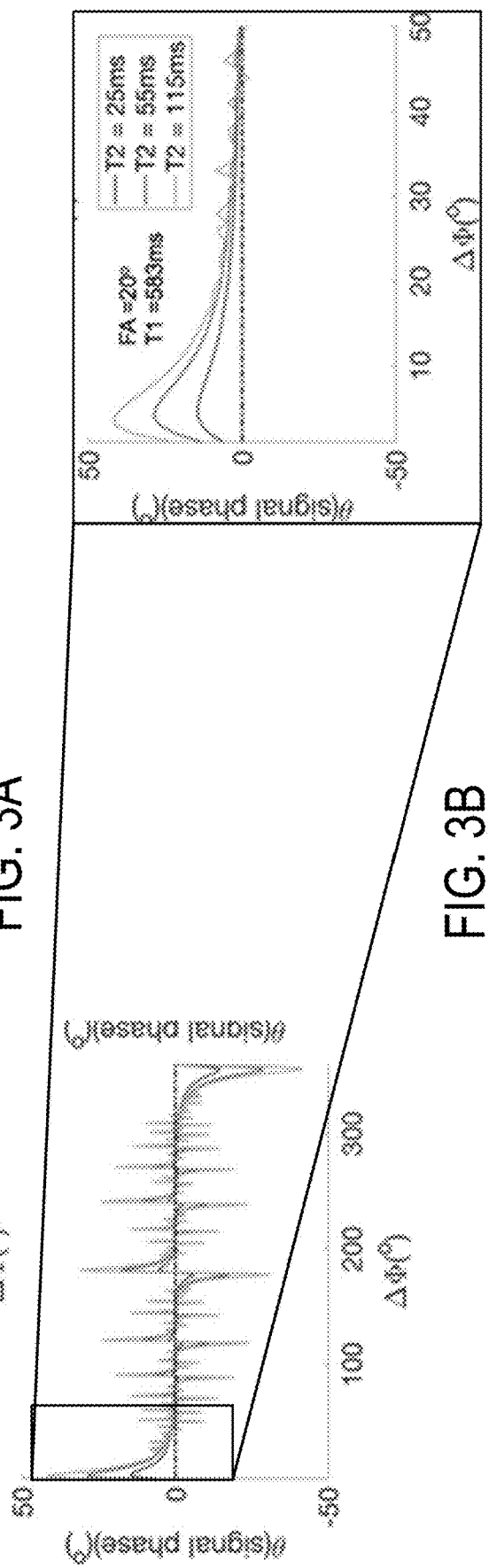
FIG. 3A
FIG. 3B

SYSTEM AND METHOD FOR MULTIPLE CONTRAST ENCODING WITH MAGNETIC RESONANCE IMAGING

STATEMENT REGARDING FEDERALLY SPONSORED RESEARCH

N/A

BACKGROUND

The field of the disclosure is systems and methods for magnetic resonance imaging ("MRI"). More particularly, the invention relates to systems and methods for magnetic resonance imaging, whereby multiple contrast encoding.

When a substance, such as human tissue, is subjected to a uniform magnetic field (polarizing field $B_0$), the individual magnetic moments of the nuclei in the tissue attempt to align with this polarizing field, but precess about it in random order at their characteristic Larmor frequency. If the substance, or tissue, is subjected to a magnetic field (excitation field $B_1$) that is in the x-y plane and that is near the Larmor frequency, the net aligned moment, $M_z$, may be rotated, or "tipped", into the x-y plane to produce a net transverse magnetic moment $M_{xy}$. A signal is emitted by the excited nuclei or "spins", after the excitation signal $B_1$ is terminated, and this signal may be received and processed to form an image.

When utilizing these "MR" signals to produce images, magnetic field gradients ($G_x$, $G_y$, and $G_z$) are employed. Typically, the region to be imaged is scanned by a sequence of measurement cycles in which these gradients vary according to the particular localization method being used. The resulting set of received MR signals are digitized and processed to reconstruct the image using one of many well-known reconstruction techniques.

To do so, the signals are often weighted in different ways to give preference to or consider different sub-signals or so-called contrast mechanisms. Two basic "contrast mechanisms" commonly utilized in MR imaging are the spin-lattice (or longitudinal or T1) relaxation time or spin-spin (or transverse or T2) relaxation time. The T1 and T2 contrast mechanism are the two most important relaxation mechanisms commonly exploited to provide soft tissue contrast in clinical MRI examinations. Both T1- and T2-weighted (T1w, T2w) acquisitions play a ubiquitous role in almost every clinical MRI exam and are important for a variety of applications including lesion detection, characterization, treatment monitoring, and many other applications. However, there are a variety of other mechanisms for eliciting contrast in MRI, including R2*. Specifically, T2* is a quantity related to T2, but including dephasing effects. That is, T2* is a quantity related to spin-spin relaxation and, in addition, relating magnetic field inhomogeneities and susceptibility effects.

These contrast mechanisms can be manipulated by selecting particular imaging parameters utilized while performing a pulse sequence to acquire MR data, so that the images reconstructed form the MR data reflect a particular weighting toward the preferred contrast mechanism that best illustrate the underlying anatomy or pathology that is the focus of the clinical analysis. Since the fundamentals of the pulse sequence and the imaging parameters dictate the contrast weighting, a variety of different pulse sequences and variations on pulse sequences have been developed.

Fast spin-echo (FSE)-based MRI using the FSE pulse sequence is the most widely used approach. Depending upon imaging parameters, FSE can be used to acquire data with T1w or T2w, but is generally limited to 2D acquisitions. FSE is a valuable pulse sequence for a variety of clinical situations. However, historically, FSE-based approaches have suffered from relatively long scan times. Recently, scan times have been reduced, in part, through the use of techniques for reducing the total amount of data required or the acquisition time slightly, such as by using parallel imaging techniques, compressed sensing reconstructions, and synthetic imaging strategies.

Regardless of the of the ability to slightly reduce acquisition times, many clinical applications require both T1w and T2w data, which necessitates at least two separate acquisitions, thus, substantially increasing the overall scan time. Furthermore, some clinical applications necessitate 3D imaging. While 3D FSE-based acquisitions are feasible and are used increasingly for clinical care, the need for extended echo trains may compromise both T1 and T2 contrast. Furthermore, the duration of the scan required to acquire 3D data with an FSE pulse sequence can make the clinical application limited, for example, because some patients cannot endure the scan time required without movement. Overall, all FSE-based imaging approaches are relatively slow and inefficient, particularly, when performing 3D acquisitions and/or needing images with multiple, different contrast weighting, such as T1w and T2w images.

Instead of FSE, some have sought to use a spoiled gradient echo (SGRE) pulse sequence for 3D T1w data acquisition, and then a separate T2w FSE-based data acquisition to acquire T2w data. This is because SGRE methods can provide high-quality T1w data acquisition using RF modulated GRE pulse sequences with RF phase increments chosen carefully and intentionally to spoil coherent transverse magnetization, leading to purely T1w signal contrast. On the other hand, T2w strategies using GRE pulse sequences are limited and/or very challenging. For example, some have attempted to use a balanced steady state free precession (bSSFP) acquisition because it can provide some degree of T2w information. However, bSSFP acquisitions have mixed T2/T1 contrast, which means that a cleanly T2-weighted image is still not available to the clinician. Furthermore, bSSFP pulse sequences suffer from banding and flow related artifacts that can occur in the presence of magnetic field (B0) inhomogeneities. As such, there is limited clinical value to trying to use SGRE to solve the shortcomings of FSE, particularly, when T1w and T2w images are required and, even more so, when 3D images are clinically required.

Thus, there is a continuing need for new MRI data acquisition, data processing, and/or image reconstruction techniques, particularly, for acquiring images from a patient with multiple contrasts, each of which meet the needs of clinicians.

SUMMARY

The present disclosure overcomes the aforementioned drawbacks by providing systems and methods for acquiring multiple, distinct contrast encoded or weighted datasets using a single MRI pulse sequence. For example, in one configuration, the present disclosure provides systems and methods for simultaneous acquisition of T1w and T2w imaging datasets using a single pulse sequence. More particularly, in one non-limiting example, the present disclosure modifies a gradient echo (GRE) pulse sequence to include an RF phase modulation that allows for the simultaneous acquisition of T1w and T2w imaging datasets. The systems and methods for specific pulse sequence strategies of the present disclosure provide for separable encoding of T1w and T2w into real and imaginary components of the complex, RF-phase-modulated GRE signal. Thus, with a single GRE pulse sequence, distinct and separate encoding of T1w and T2w dataset are generated. As such, in accordance with the present disclosure, one pulse sequence can yield multiple, distinct datasets with separate and distinct contrast weightings.

In accordance with one aspect of the disclosure, a magnetic resonance imaging (MRI) system is provided that includes a magnet system configured to generate a polarizing magnetic field about at least a portion of a subject arranged in the MRI system and a plurality of gradient coils configured to apply magnetic gradients to the polarizing magnetic field. The MRI system further includes a radio frequency (RF) system configured to apply an excitation field to the subject and acquire MR image data from the subject and a computer system. The computer system is programmed to control the plurality of gradient coils and the RF system to perform a gradient echo pulse sequence that includes a phase increment of an RF pulse of the gradient echo pulse sequence selected to encode longitudinal relaxation (T1) information in an imaginary component of a magnetic resonance (MR) data received from the subject and encode at least transverse relaxation (T2) information in a real component of the MR data received from the subject. The computer system is further configured to process the MR data to determine the T1 information from the imaginary component of the MR data and determine the T2 information from the real component of the MR data and generate at least one of a T1 image or map or a T2 image or map of the subject. The MRI system also includes a display configured to display the at least one of the T1 image or map or the T2 image or map of the subject.

In accordance with another aspect of the disclosure, a method is provided for producing at least one of an image or a quantitative map of a subject. The method includes controlling a magnetic resonance imaging system to perform a pulse sequence that includes at least one phase increment of an RF pulse of a gradient echo pulse sequence configured to encode longitudinal relaxation (T1) information in an imaginary component of a magnetic resonance (MR) data received from the subject and encode at least transverse relaxation (T2) information in a real component of the MR data received from the subject. The method also includes generating a T1 image or map of the subject or a T2 image or map of the subject from the MR data and displaying the T1 image or map or the T2 image or map of the subject.

The foregoing and other aspects and advantages of the invention will appear from the following description. In the description, reference is made to the accompanying drawings, which form a part hereof, and in which there is shown by way of illustration a preferred embodiment of the invention. Such embodiment does not necessarily represent the full scope of the invention, however, and reference is made therefore to the claims and herein for interpreting the scope of the invention.

BRIEF DESCRIPTION OF THE DRAWINGS

FIG. 3A is a graph showing signal magnitude plotted against $\Delta\phi$.

FIG. 3B is a graph showing signal phase plotted against $\Delta\phi$ varying with T2.

DETAILED DESCRIPTION

Figure 1:
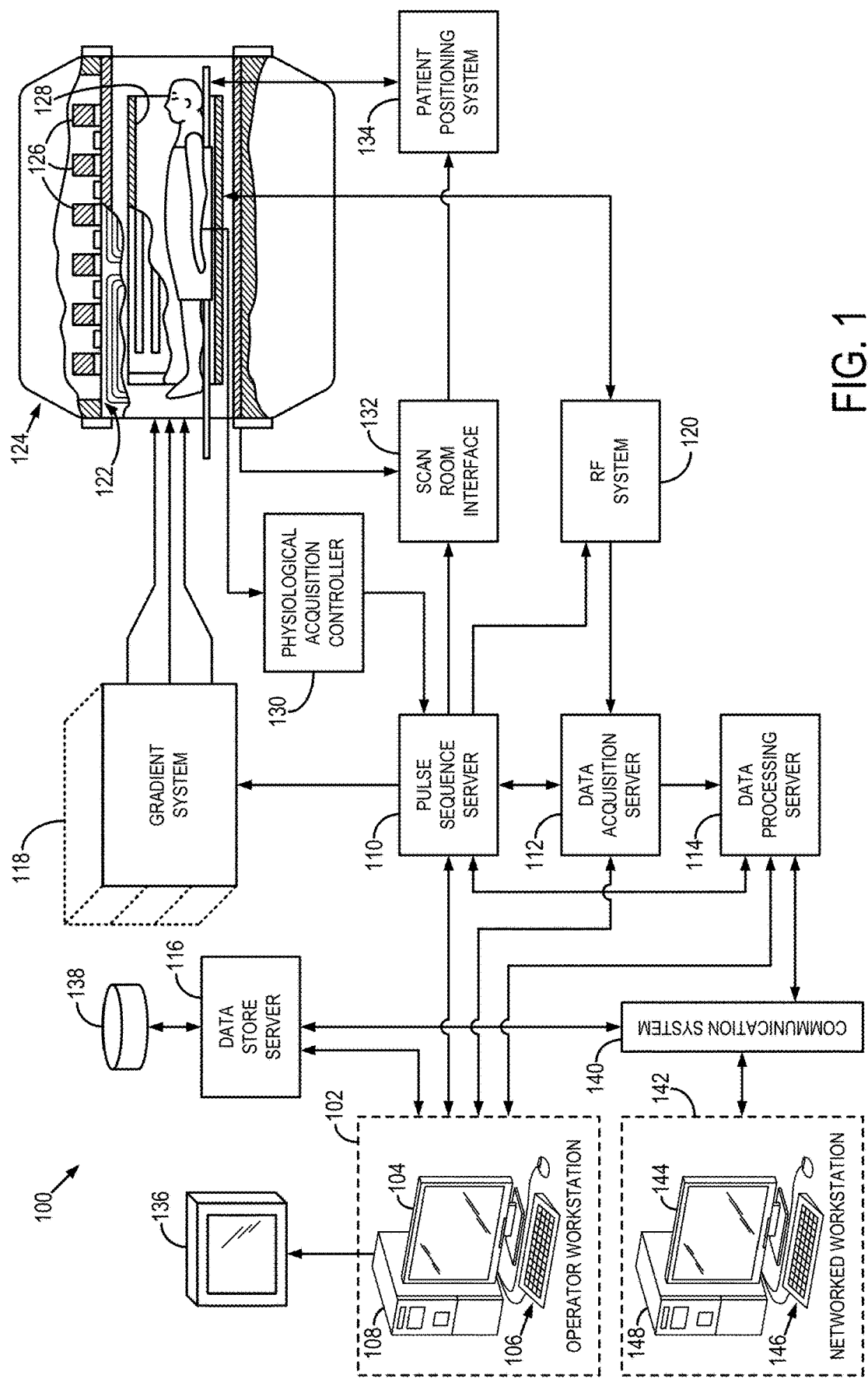
FIG. 1 is a block diagram of an exemplary magnetic resonance imaging ("MRI") system configured in accordance with the present disclosure.

Referring now to FIG. 1, a magnetic resonance imaging (MRI) system 100 is provided that may be configured, programmed, or otherwise utilized in accordance with the present disclosure. The MRI system 100 includes an operator workstation 102, which will typically include a display 104, one or more input devices 106 (such as a keyboard and mouse or the like), and a processor 108. The processor 108 may include a commercially available programmable machine running a commercially available operating system. The operator workstation 102 provides the operator interface that enables scan prescriptions to be entered into the MRI system 100. In general, the operator workstation 102 may be coupled to multiple servers, including a pulse sequence server 110; a data acquisition server 112; a data processing server 114; and a data store server 116. The operator workstation 102 and each server 110, 112, 114, and 116 are connected to communicate with each other. For example, the servers 110, 112, 114, and 116 may be connected via a communication system 140, which may include any suitable network connection, whether wired, wireless, or a combination of both. As an example, the communication system 140 may include both proprietary or dedicated networks, as well as open networks, such as the internet.

The pulse sequence server 110 functions in response to instructions downloaded from the operator workstation 102 to operate a gradient system 118 and a radiofrequency (RF) system 120. Gradient waveforms to perform the prescribed scan are produced and applied to the gradient system 118, which excites gradient coils in an assembly 122 to produce the magnetic field gradients $G_x$, $G_y$, $G_z$ used for position encoding magnetic resonance signals. The gradient coil assembly 122 forms part of a magnet assembly 124 that includes a polarizing magnet 126 and a whole-body RF coil 128.

RF waveforms are applied by the RF system 120 to the RF coil 128, or a separate local coil (not shown in FIG. 1), in order to perform the prescribed magnetic resonance pulse sequence. Responsive magnetic resonance signals detected by the RF coil 128, or a separate local coil, are received by the RF system 120, where they are amplified, demodulated, filtered, and digitized under direction of commands produced by the pulse sequence server 110. The RF system 120 includes an RF transmitter for producing a wide variety of RF pulses used in MRI pulse sequences. The RF transmitter is responsive to the scan prescription and direction from the pulse sequence server 110 to produce RF pulses of the desired frequency, phase, and pulse amplitude waveform. The generated RF pulses may be applied to the whole-body RF coil 128 or to one or more local coils or coil arrays.

The RF system 120 also includes one or more RF receiver channels. Each RF receiver channel includes an RF preamplifier that amplifies the magnetic resonance signal received by the coil 128 to which it is connected, and a detector that detects and digitizes the I and Q quadrature components of the received magnetic resonance signal. The magnitude of the received magnetic resonance signal may, therefore, be determined at any sampled point by the square root of the sum of the squares of the I and Q components:

$$M=\sqrt{I^2+Q^2} \qquad \text{Eqn. 1;}$$

and the phase of the received magnetic resonance signal may also be determined according to the following relationship:

$$\varphi = \tan^{-1}\left(\frac{Q}{I}\right). \qquad \text{Eqn. 2}$$

The pulse sequence server 110 also optionally receives patient data from a physiological acquisition controller 130. By way of example, the physiological acquisition controller 130 may receive signals from a number of different sensors connected to the patient, such as electrocardiograph (ECG) signals from electrodes, or respiratory signals from a respiratory bellows or other respiratory monitoring device. Such signals are typically used by the pulse sequence server 110 to synchronize, or "gate," the performance of the scan with the subject's heart beat or respiration.

The pulse sequence server 110 also connects to a scan room interface circuit 132 that receives signals from various sensors associated with the condition of the patient and the magnet system. It is also through the scan room interface circuit 132 that a patient positioning system 134 receives commands to move the patient to desired positions during the scan.

The digitized magnetic resonance signal samples produced by the RF system 120 are received by the data acquisition server 112. The data acquisition server 112 operates in response to instructions downloaded from the operator workstation 102 to receive the real-time magnetic resonance data and provide buffer storage, such that no data is lost by data overrun. In some scans, the data acquisition server 112 does little more than pass the acquired magnetic resonance data to the data processor server 114. However, in scans that require information derived from acquired magnetic resonance data to control the further performance of the scan, the data acquisition server 112 is programmed to produce such information and convey it to the pulse sequence server 110. For example, during prescans, magnetic resonance data is acquired and used to calibrate the pulse sequence performed by the pulse sequence server 110. As another example, navigator signals may be acquired and used to adjust the operating parameters of the RF system 120 or the gradient system 118, or to control the view order in which k-space is sampled.

The data processing server 114 receives magnetic resonance data from the data acquisition server 112 and processes it in accordance with instructions downloaded from the operator workstation 102. Such processing may, for example, include one or more of the following: reconstructing two-dimensional or three-dimensional images by performing a Fourier transformation of raw k-space data; performing other image reconstruction techniques, such as iterative or back projection reconstruction techniques; applying filters to raw k-space data or to reconstructed images; generating functional magnetic resonance images; calculating motion or flow images; and so on.

Images reconstructed by the data processing server 114 are conveyed back to the operator workstation 102. Images may be output to operator display 112 or a display 136 that is located near the magnet assembly 124 for use by attending clinician. Batch mode images or selected real time images are stored in a host database on disc storage 138. When such images have been reconstructed and transferred to storage, the data processing server 114 notifies the data store server 116 on the operator workstation 102. The operator workstation 102 may be used by an operator to archive the images, produce films, or send the images via a network to other facilities.

The MRI system 100 may also include one or more networked workstations 142. By way of example, a networked workstation 142 may include a display 144, one or more input devices 146 (such as a keyboard and mouse or the like), and a processor 148. The networked workstation 142 may be located within the same facility as the operator workstation 102, or in a different facility, such as a different healthcare institution or clinic. The networked workstation 142 may include a mobile device, including phones or tablets.

The networked workstation 142, whether within the same facility or in a different facility as the operator workstation 102, may gain remote access to the data processing server 114 or data store server 116 via the communication system 140. Accordingly, multiple networked workstations 142 may have access to the data processing server 114 and the data store server 116. In this manner, magnetic resonance data, reconstructed images, or other data may exchanged between the data processing server 114 or the data store server 116 and the networked workstations 142, such that the data or images may be remotely processed by a networked workstation 142. This data may be exchanged in any suitable format, such as in accordance with the transmission control protocol (TCP), the internet protocol (IP), or other known or suitable protocols.

Figure 2:
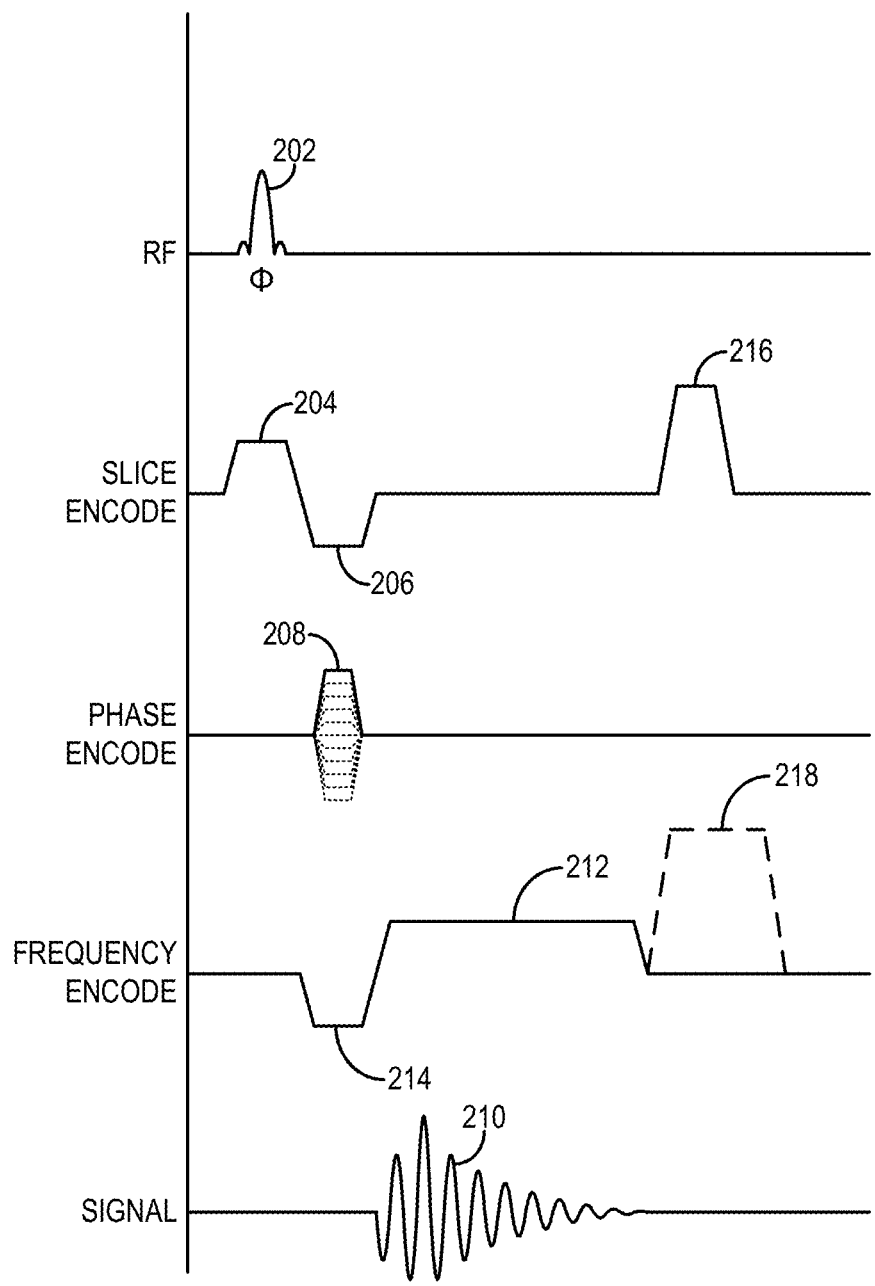
FIG. 2 is a graphic representation of an exemplary pulse sequence for directing the MRI system of FIG. 1.

The above-described MRI system can be used to implement a variety of pulse sequences to effectuate desired imaging studies. As will be described herein one category of pulse sequence is the gradient echo (GRE) sequence and variations thereof, such as the spoiled gradient echo (SGRE) pulse sequence. An example pulse sequence that can be employed to direct the MRI system to acquire data in accordance with some embodiments described in the present disclosure is illustrated in FIG. 2. This example pulse sequence is a spoiled gradient (SGRE) pulse sequence. In some settings, the pulse sequence can include a radio frequency (RF) excitation pulse 202 with a large phase, such as 117°, that is played out in the presence of a slice-selective gradient 204 in order to produce transverse magnetization in a prescribed imaging slice. The RF excitation pulse 202 with the large phase may be a spatially selective RF excitation pulse, a spectrally selective RF excitation pulse, or both. The slice-selective gradient 204 includes a rephasing lobe 206 that acts to rephase unwanted phase dispersions introduced by the slice-selective gradient 204, such that signal losses resultant from these phase dispersions are mitigated. Following excitation of the nuclear spins in the prescribed imaging slice, a phase encoding gradient 208 is applied to spatially encode a magnetic resonance signal, representative of a gradient-recalled echo 210, along one direction in the prescribed imaging slice. A readout gradient 212 is also applied after a dephasing gradient lobe 214 to spatially encode the signal representative of the echo 210 along a second, orthogonal direction in the prescribed imaging slice. The signal representative of the echo 210 is sampled during a data acquisition window.

Unlike a standard gradient echo sequence, the SGRE sequence removes a second phase encoding gradient applied after the readout gradient 212 that is a mirror image of the phase encoding gradient 208 at the beginning of the pulse sequence. Instead, the pulse sequence concludes with the application of a spoiler gradient 216 that spoils the remaining transverse magnetization. The pulse sequence is repeated and the amplitude of the phase encoding gradient 204 is stepped through a set of values such that k-space is sampled in a prescribed manner. After the desired amount of data have been acquired for the prescribed imaging slice, the pulse sequence is again repeated a plurality of times (e.g., for each phase-encoding step) while applying a different slice-selective gradient 204 to acquire data from a different imaging slice. This process is repeated until data have been acquired from the desired number of imaging slices.

Complete spoiling of transverse magnetization is generally assumed when using spoiled gradient echo (SGRE) acquisitions, such as described above. With this assumption, The steady-state signal is determined by T1, T2, TR, flip angle, and these coefficients as described in the following equations 3-5 follow. Specifically, the signal equation that describes the MR signal immediately after RF excitation (ignoring $T_2^*$ decay for simplicity) can be written as:

$$S_{SGRE} M_0, T_1 \mid \alpha, TR) = M_0 \cdot \frac{(1-e^{-TR/T_1})\sin(\alpha)}{(1-e^{-TR/T_1}\cos(\alpha))} \cdot e^{i\theta'}; \quad \text{Eqn. 3}$$

where $M_0$ is the magnetization at thermal equilibrium, $\alpha$ is the flip angle and $\theta'$ is the local background phase due to effects such as complex coil sensitivity, eddy currents, $B_0$ inhomogeneities, and the like.

As described above with respect to FIG. 2, the RF spoiling targets the transverse magnetization. To implement the spoiling, a phase increment to the RF excitation can be used. The phase sequence is defined by the difference between the $n^{th}$ and the $(n+1)^{th}$ RF excitation, such that $\phi(n)=\phi_0+n\cdot\Delta\phi$ (n=0, . . . ), where $\phi$ is the phase, $\phi_0$ is the initial phase, and $\Delta\phi$ is the phase increment as n is incremented. There are a number of solutions for $\Delta\phi$ that lead to incoherence of the steady state transverse magnetization, highly appropriate for RF spoiling. If the RF phase increment ($\Delta\phi$) is chosen carefully, transverse magnetization accumulates in an incoherent manner and is effectively spoiled.

As an example, FIG. 3A shows simulated gradient echo magnitude and FIG. 3B shows simulated gradient echo phase of the observed signal as a function of the $\Delta\phi$, at different T2 values. Areas that cross the perfectly spoiled theoretical signal are chosen as solutions for RF spoiling.

Thus, the choice of RF phase increment is important for effective RF spoiling. Large RF phase increments, such as 117° as has been commonly used in techniques focused on magnitude alone, lead to excellent RF spoiling and the signal closely approximates the ideal SGRE signal magnitude in equation 3. That is, the use of phase cycling creates a pseudo-random phase of the excited signal to avoid the buildup of transverse magnetization. In this way, the steady state signal of a rapid gradient echo technique is only dependent on T1, leading to pure T1-weighted imaging. This approach has been the standard means by which "spoiling" for gradient echo imaging is performed for most commercial applications and is commonly referenced to as "spoiled gradient echo imaging."

However, contrary to the traditional teachings for pulse sequences seeking to quantify MR parameters, which seek to minimize the influence of the phase of the MR signal and utilize large RF phase increments to spoil coherent transverse magnetization that continues T2 weighted signal (e.g., phase increments of multiple tens of degrees, such as 100 degrees or 117 degrees) to rely on the magnitude of the MR signal, the present disclosure recognizes that the phase of the signal can be used to great advantage in quantification of MR parameters, such as T1 and T2, even simultaneously. The present disclosure recognizes the dependence of the signal phase and magnitude on T2 of the tissue, at low RF phase increments ($\Delta\phi$), as can be seen in FIGS. 3A and 3B. As can be seen from this figure for low $\Delta\phi$ (on the order of just a few degrees), there is a strong dependence of the measured phase on the T2 of the tissue. That is, the magnitude of the signal ($\eta$) shows moderate dependence on T2, weak dependence on flip angle for flip angles larger than 10°, and heavy dependence on T1. However, there are some special cases of particular larger increments greater than, for example, 1-5° that preserve the transverse magnetization, for example, 32.2°. Regardless of the particular value of the increment, the present disclosure recognizes that, when the increment is properly selected, the phase presents a different story. The present disclosure identified this use of phase increments to induce distinct results in amplitude versus phase and created systems and methods to create improved clinical results by creating a pulse sequence where both T1w and T2w data can be acquired during the same GRE or SGRE pulse sequence, thereby, eliminating the need for multiple acquisitions, such as multiple FSE acquisitions or combinations of FSE and SGRE acquisitions.

In order to explain the characteristics and contrast of the steady-state of RF phase modulated SGRE, an approach as described in Sobol W T, Gauntt D M. On the stationary states in gradient echo imaging. Journal of Magnetic Resonance Imaging 1996; 6(2):384-398 can be utilized, which utilize the configuration theory described in Hennig J. Echoes—how to generate, recognize, use or avoid them in MR-imaging sequences. Part II: Echoes in imaging sequences. Concepts in Magnetic Resonance 1991; 3(4): 179-192, both of which are incorporated herein by reference in their entirety. For illustration, consider a sequence with an RF pulse with flip angle (FA) of $\alpha$, RF phase of $\phi$, and repetition time of TR. RF phase modulation is performed by incrementing the transmit RF phase ($\phi$) quadratically such that $\phi(n)=\phi(n-1)+n\theta$, where $\theta$ is the RF phase increment. In this case, the steady-state complex signal (S) after RF excitation can be expressed as:

$$Re(S) = \beta \eta e^{\frac{TR}{T2}}; \qquad \text{Eqn. 4}$$

$$Im(S) = \beta \left[ \eta^2 - \epsilon \left( e^{\frac{TR}{T2}} - \epsilon \right) \right]; \qquad \text{Eqn. 5}$$

with $$\beta = \frac{\left(1 - e^{\frac{TR}{T1}}\right) M_0 \sin\alpha}{\left(e^{\frac{TR}{T2}} - \epsilon\right)\left[e^{\frac{TR}{T2}}\left(\cos\alpha - e^{\frac{TR}{T1}}\right) + \epsilon\left(1 - e^{\frac{TR}{T1}} \cos\alpha\right)\right] - \eta^2\left(1 - e^{\frac{TR}{T1}} \cos\alpha\right)}; \qquad \text{Eqn. 6}$$

where $M_0$ is the proton density, and E and n are real coefficients defined as:

$$\epsilon = Re\left(\frac{\lambda - \Omega_{22}}{\Omega_{21}}\right) \text{ and } \eta = Im\left(\frac{\lambda - \Omega_{22}}{\Omega_{21}}\right); \qquad \text{Eqn. 7}$$

with $$\lambda = \frac{2}{\Omega_{11} + \Omega_{22} + \sqrt{(\Omega_{11} + \Omega_{22})^2 - 4}}; \qquad \text{Eqn. 8}$$

where $\lambda$, $\epsilon$ and n can be determined from the diagonal elements, $\Omega_{11}$ and $\Omega_{22}$, of the recursive matrix equation:

$$\begin{Bmatrix} \Omega_{11} & \Omega_{21} \\ \Omega_{21} & \Omega_{22} \end{Bmatrix} = \Psi_L \Psi_{L-1} \ldots \Psi_1, ; \qquad \text{Eqn. 9}$$

with the matrix $\Psi_l$ defined as:

$$\Psi_l = \frac{1}{(1 + \cos\alpha)\left(1 - e^{-\frac{TR}{T1}} e^{j\theta l}\right)} \qquad \text{Eqn. 10}$$

$$\cdot \begin{bmatrix} 2e^{-\frac{TR}{T2}} \cdot \left(\cos\alpha - e^{-\frac{TR}{T1}} e^{j\theta l}\right) & (1 - \cos\alpha)\left(1 + e^{-\frac{TR}{T1}} e^{j\theta l}\right) \cdot e^{-j\theta l^2} \\ -(1 - \cos\alpha)\left(1 + e^{-\frac{TR}{T1}} e^{j\theta l}\right) e^{j\theta l^2} & 2e^{\frac{TR}{T2}}\left(1 - e^{-\frac{TR}{T1}} \cos\alpha \cdot e^{j\theta l}\right) \end{bmatrix};$$

where $l=1, \ldots, L$, where L is an integer determined to satisfy the following condition:

$$\frac{\theta}{2} \cdot L = N \cdot \pi \ (N = 0, 1, 2, 3, \cdots).; \qquad \text{Eqn. 11}$$

with N is the minimum integer number to satisfy equation 11. For example, if $\theta=2°=\pi/90$, the smallest value of N that satisfies equation 11 is 1, and L=180.

Importantly, it is noted that equations 4 and 5 show that real and imaginary components of the steady-state have different contrast weighting. The present disclosure recognizes that it is possible to control the contrast weighting of particular datasets by changing $\epsilon$ and $\eta$, which depend on TR, $\alpha$, and $\theta$. In particular, the present disclosure recognizes that the RF phase increment, $\theta$, can be used as a parameter that adjusts image contrast, thereby allowing a clinician to select different contrast weightings and, ultimately, multiple contrast weightings for datasets acquired with a single pulse sequence.

Figure 4A:
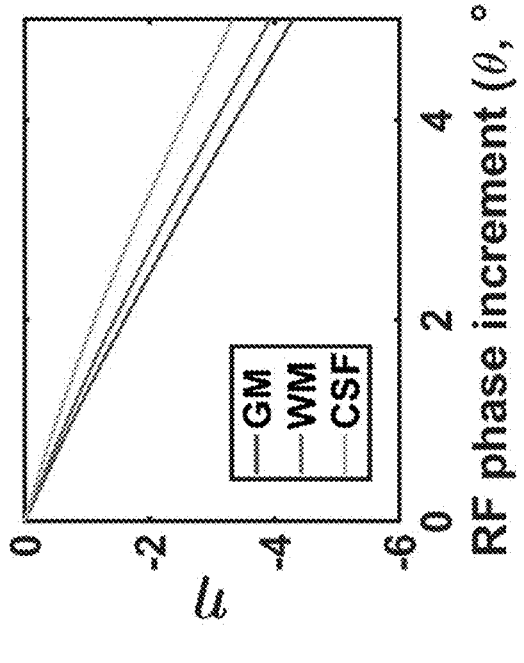
FIG. 4A is a graph of $\in$ against RF phase increment.
Figure 4B:
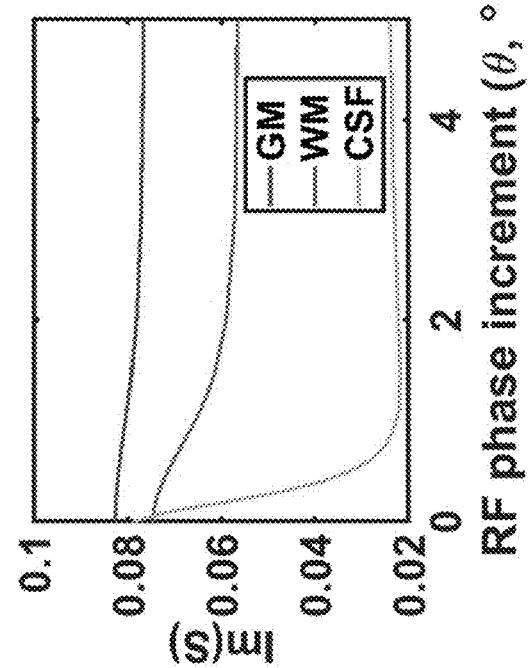
FIG. 4B is a graph of $\eta$ against RF phase increment.

In particular, FIGS. 4A and 4B are plots of $\epsilon$ and $\eta$ for various T1 and T2 values for a range of small RF phase increment values, with, for example TR of 10 ms, and small flip angle of, for example, 10°. The values monotonically decrease with RF phase increment in all tissues shown. This behavior implies that the contrast of the RF phase modulated GRE imaging can be controlled by adjusting the RF phase increment. That is, both $\epsilon$ and $\eta$ decrease monotonically as $\theta$ increases over small RF phase increment range. Relatively large RF phase increments makes the absolute value of $\eta$ large, which results in T1-weighted in both real and imaginary components.

Figure 4C:
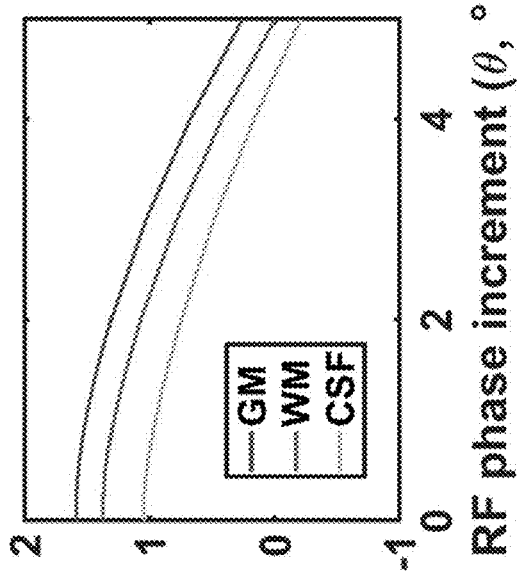
FIG. 4C is a graph of real signal against RF phase increment.
Figure 4D:
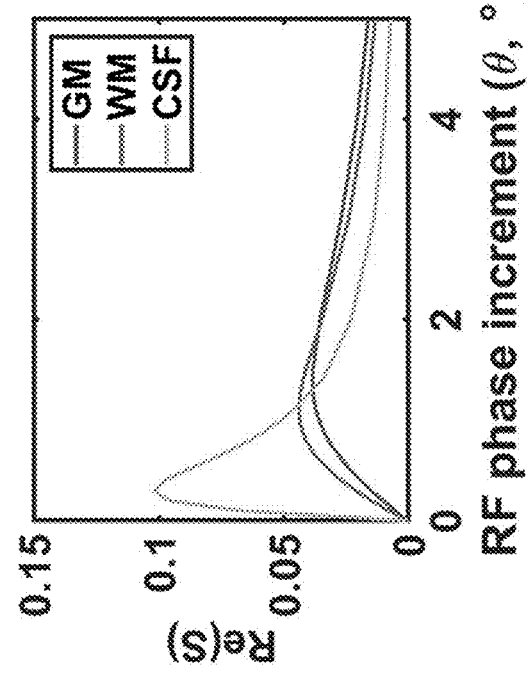
FIG. 4D is a graph of imaginary signal against RF phase increment.
Figures 5A, 5B, 5C, 5D:
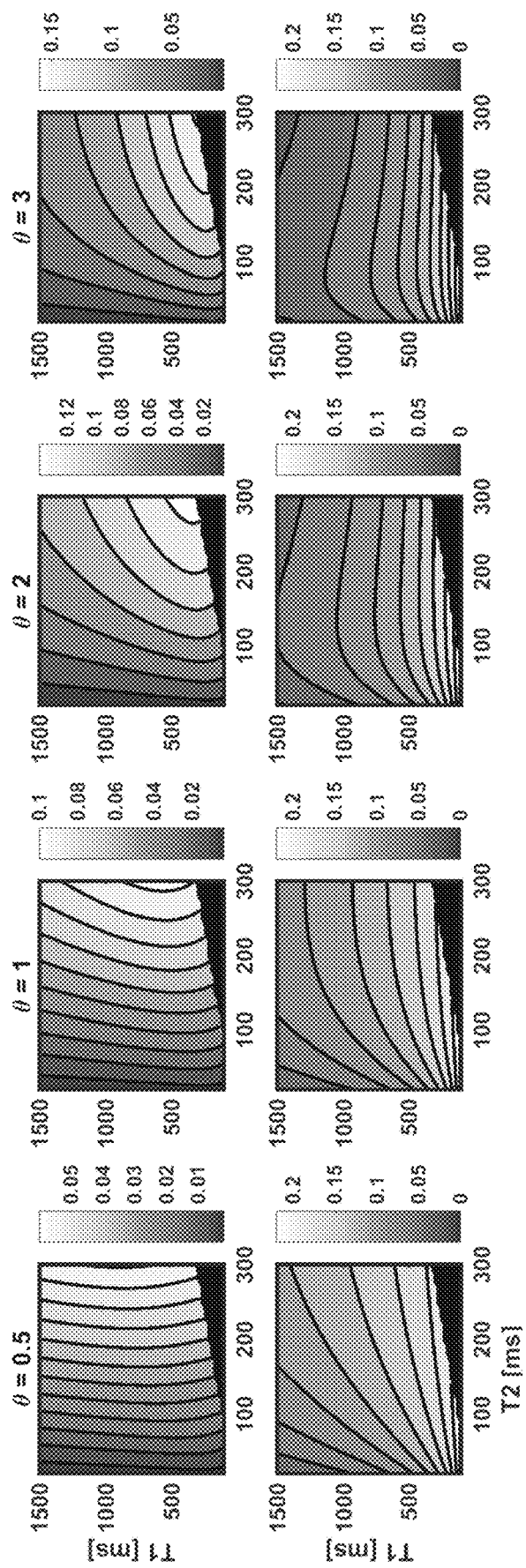
FIG. 5A is a set of graphs of real (top graph) and imaginary (bottom graph) steady-state signal intensity as a function of T1 and T2 for a phase increment of 0.5.
FIG. 5B is a set of graphs of real (top graph) and imaginary (bottom graph) steady-state signal intensity as a function of T1 and T2 for a phase increment of 1.
FIG. 5C is a set of graphs of real (top graph) and imaginary (bottom graph) steady-state signal intensity as a function of T1 and T2 for a phase increment of 2.
FIG. 5D is a set of graphs of real (top graph) and imaginary (bottom graph) steady-state signal intensity as a function of T1 and T2 for a phase increment of 3.

Indeed, equation 5 becomes equivalent to the SGRE signal equation when $\eta$ is sufficiently large ($|\eta|\gg1$). Conversely, when small RF phase increments are used, the real component of the signal becomes more T2 weighted. As shown in FIGS. 4C and 4D, plots of the real and imaginary components of the signal as a function of RF phase increment explicitly demonstrate this behavior, using typical T1 and T2 values for gray matter (GM), white matter (WM) and cerebrospinal fluid (CSF) to illustrate this effect.

Turning to FIGS. 5A-5D, pairs of plots for the real and imaginary components from equations 7 and 8 with TR of 10 ms and 25° flip angle for different RF phase increments over a relatively wide range of T1 and T2 values that are commonly experienced in vivo. In each pair of plots, the top plot is the real part and the bottom plot is the imaginary part of the RF phase modulated GRE signal as a function of T1 and T2. This illustrates a realization of the present disclosure that, over a range of small RF phase increments, the imaginary signal is depends heavily on T1, whereas the real component depends on both T1 and T2. These contour plots of FIGS. 5A-5D indicate that smaller RF phase increment provides higher T2w contrast in the real part of the signal. The blackened area corresponds to non-physical combinations of T1 and T2 (T1<T2, which is non-physical). That is, for the real component, for a fixed T1, increasing T2 leads to a monotonic increase in the real component of the complex GRE signal. Similarly, for the imaginary component, for a fixed T2, increasing T1 leads to a separable decrease in signal with increasing T1. Hence, FIGS. 5A-5D explicitly plots the effect described above with respect to equations 4 and 5.

With this discovery in place, the present disclosure provides systems and methods to create an RF modulated GRE pulse sequenced using carefully-selected RF phase increments, such as less than 1°, 2°, or 3° (or fractional values between these whole numbers), other increments of 1° to 25° or more (or fractional values between), or special values, such as 32.2°. The important point is to select an increment, whether large or small, that yields a desired separation of the T1w and T2w signal components into the real and imaginary components of the complex signal. In some applications, the angle may be other values, so long as it is a non-zero value because a zero value does not provide phase information. That is, the exact flip angle can be selected for specific ranges of T1 and T2, where the optimal RF phase increment may vary from application to application while being non-zero.

Figure 6:
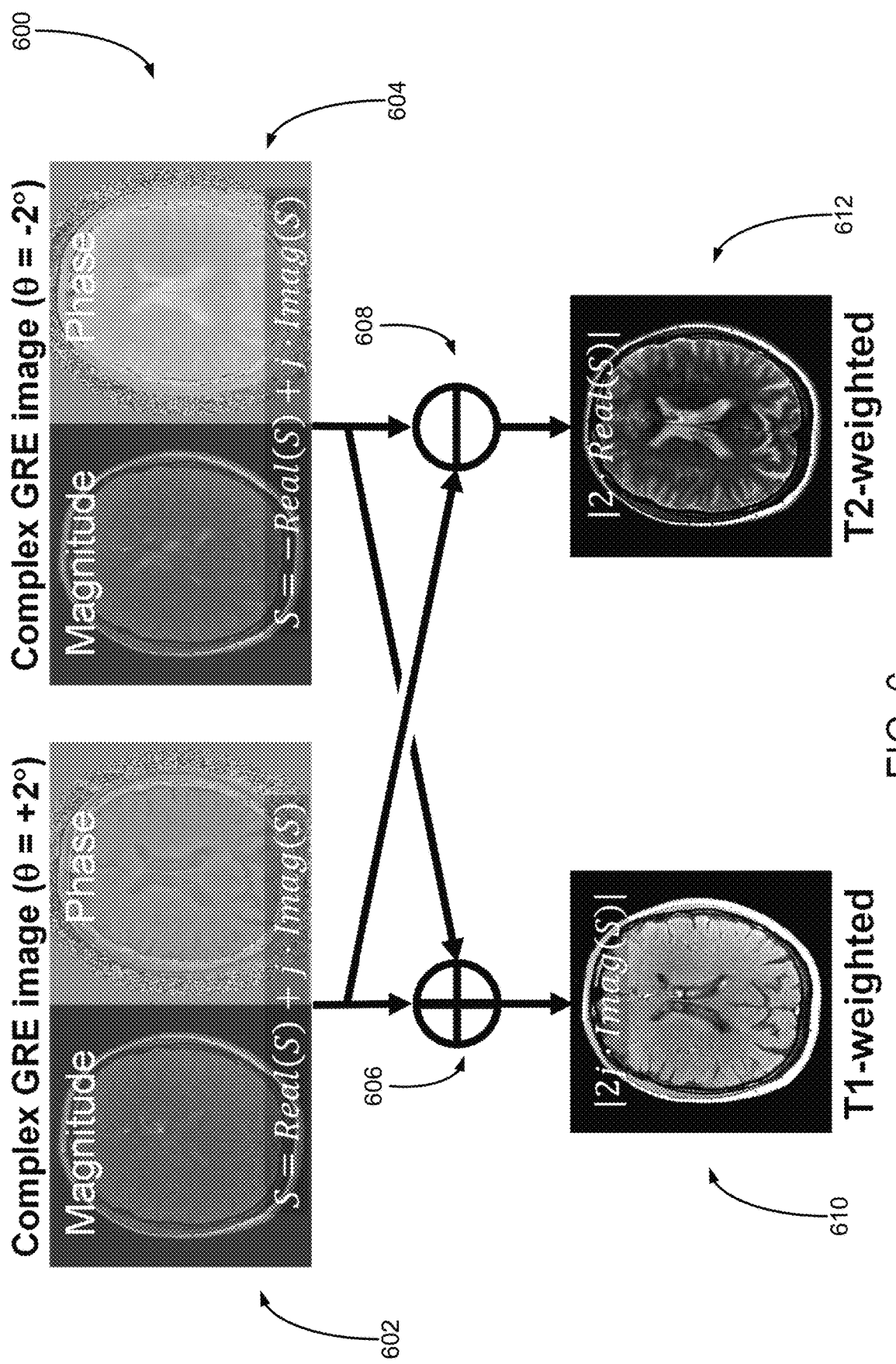
FIG. 6 is a schematic illustrating one, non-limiting reconstruction scheme for removing background phase.

Importantly, the present disclosure also recognizes that complex RF phase modulated GRE imaging can also contain background phase shifts related to system imperfections including time independent phase shifts related to the receiver coil, complex B1 inhomogeneities, as well as time dependent phase shifts due to magnetic field (B0) inhomogeneities. With this recognition in place, the present disclosure provides systems and methods to control or remove background phase. This can be performed in a variety of ways. In one situation, two passes of the RF phase modulated GRE acquisition may be performed. In one, non-limiting example, the RF phase increment can be reversed from positive to negative in a second pass acquisition. The second pass may be a low-resolution acquisition, including even provided a calibration scan in a parallel imaging acquisition or a navigator-type image. Furthermore, in clinical application where multiple acquisitions are required, such as contrast-enhanced imaging where acquisitions are performed during inflow, only one set of data with the background phase is required. By performing a phase subtraction, the effects of background phase can be efficiently reduced or removed. This non-limiting example of a two-pass approach is graphically illustrated in FIG. 6. That is, a reconstruction scheme 600 is provided that uses a dataset 602 acquired using a positive RF phase increment and a dataset 604 acquired using a negative RF phase increment during a two-pass the acquisition. As can be seen, the sign of η is inverted from one dataset 602 to the other dataset 604, while E remains the same. Therefore, the real and imaginary components can be extracted by adding 606 and subtracting 608 the images acquired in the two passes to yield T1w images 610 and T2w images 612, where any background phase has been removed.

Figure 7:
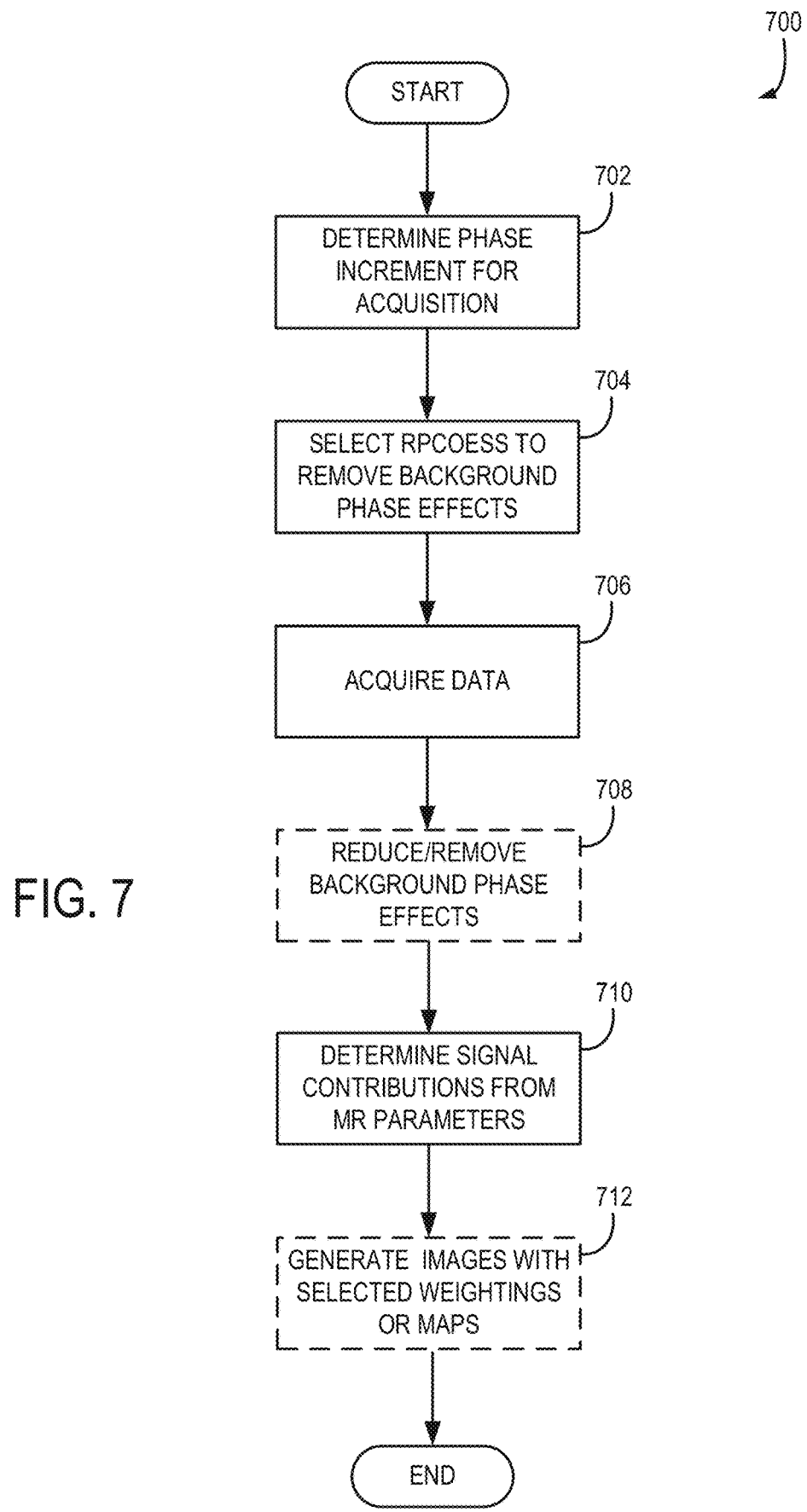
FIG. 7 is a flow chart setting forth some non-limiting steps of a method in accordance with one aspect of the present disclosure.

Turning now to FIG. 7, a flow chart setting forth the steps of a non-limiting, example process 700 in accordance with the present disclosure is provided. The process 700 begins at process block 702 with the determination of a phase increment or increments to be used during data acquisition. To do so, for example, a user may indicate either a specific relative weighting for T1 and T2 dataset, or a particular phase increment or increments to be used during acquisition. Furthermore, a user may indicate a particular clinical application that the system then uses to determine a relative weighting or phase increment that would be useful or desirable for the clinical application provided by the user.

At process block 704, a process is selected to remove background phase effects. For example, as described above, a multi-pass acquisition may be used, for example, with the phase increment reversed from negative to positive or vice versa between passes.

At process block 706, data acquisition using the pulse sequence prescribed using the above-described steps is performed. At process block 708, background phase effects are reduced or removed. If the above-described two-pass strategy with equal and opposite RF phase increments during the acquisition is used, a subtraction is performed to find the difference in phase between the two gradient echo acquisitions, which removes the background phase and provides a signal that is a function of T2, T1, and a flip angle. At process block 710, the contributions of the MR parameters (e.g., T2, T1, and flip angle) can be determined. Thus, at process block 712, images with selected weightings (e.g., separate T1w and T2w images) or maps (e.g., either or both T1 and T2 maps) can be generated or displayed to a clinician. As used herein T1 images or maps or T2 images or maps may include a variety of images and maps. For example, a T1 or T2 image may include an anatomical image where the primary contrast mechanism reflected in the image is provided by T1 or T2, respectively. Likewise, T1 maps or T2 maps may be generated from such data. Additionally, or alternatively, such images or maps may be generated from data that includes an augmented a signal weighting. Also, mixed contrasts may be used, such as a mixture of T1 and T2 contrast, or proton density weighting, which likewise includes a slight mix of T1 and T2 contrast.

SIMULATIONS AND STUDIES

To demonstrate the effectiveness of the above-described systems and methods, simulations and studies were performed. First, Bloch equation simulations were performed to validate the above-described systems and methods. Second, simulations were also performed with a digital phantom. Then, studies were performed using phantoms to further demonstrate the feasibility of this method. Finally, volunteer experiments were performed and compared to conventional T1w and T2w imaging to demonstrate the above-described systems and methods in vivo.

Simulations

As described above, two sets of simulations were performed. First, Bloch equation simulations were performed to validate the signal characteristics predicted in equations 4 and 5. Steady-state signals with varying T1 (100-1500 ms) and T2 (20-300 ms) values were calculated using the following parameters: FA=25°, TR=10 ms, and θ=1°. A total of 100 isochromats were used in the Bloch equation simulation. The simulations were structured to ensure that the signal reached steady-state after about 600th RF excitation for all combinations of T1 and T2. Non-physical combinations of T1 and T2 (T1<T2) were excluded.

Then, a digital phantom was selected that included anatomical representations of the brain with physiological T1 and T2 values mapped within the images. Using the digital phantom, equations 4 and 5 were used to predict the GRE signal generated using RF phase modulated GRE imaging with variable RF phase increments and flip angles. In addition, a smoothly varying phase error was added to each acquisition in order to simulate background phase errors. The distribution of the phase error $\Delta\phi$ was determined using the linear combination of the polynomials defined as:

$$\Delta\phi = \sum_{j=0}^{2}\sum_{i=0}^{2} a_i b_j \left(\frac{x}{L_x}\right)^i \left(\frac{y}{L_y}\right)^j; \qquad \text{Eqn. 11}$$

where a and b are the linear combination coefficient, x and y are the coordinate of the image, and $L_x$ and $L_y$ are the image size along x and y. The values of a and b were determined randomly such that the peak-to-peak magnitude of the phase error was less than 6π.

Using the above-described, two-pass strategy, phase subtraction was performed, and the real and imaginary components of the resulting signal difference were used to generate separable T1w and T2w images.

Phantom Studies

A phantom consisting of a 4×4 matrix of 16 vials was constructed to create varying combinations of T1 and T2. T1 was modulated through increasing concentrations of $MnCl_2$ ranging from (0.0, 0.5, 1.0, and 2.0 mM), while T2 was modulated by adding increasing concentrations of agar with increasing concentrations from (0.5, 1.0, 2.0, and 4.0 weight/volume %). Conventional T2w spin-echo (SE) imaging with increasing echo times, and inversion recovery fast spin echo (IR-FSE) imaging at multiple inversion times was performed to provide accurate T1 and T2 reference values. T2w SE images for T2 mapping were acquired using the following parameters: TR=6000 ms; TEs=11, 50, 10, and 150 ms; FOV=18 cm×18 cm; matrix=128×128; slices=1; slice thickness=15 mm; Bandwidth=±83.33 kHz. IR-FSE images for T1 mapping were acquired with the following parameters: TR=6000 ms; TE=11 ms; inversion time=50, 500, 1000, 1500, 2500, 3500, and 4000 ms; FOV=18 cm×18 cm; matrix=256×256; slices=1; slice thickness=15 mm; receiver bandwidth=±25 kHz. Conventional T2w FSE and T1w SGRE imaging was also performed to serve as a qualitative reference standard to compare to the proposed 3D RF phase modulated GRE method. Acquisition parameters for the proposed method are as follows: TR=10 ms; TE=1.87 ms; FA=10°; FOV=20 cm×20 cm×4 cm; matrix size=256×160×8; bandwidth=488 Hz/Px; RF phase increment=1°; scan time=0:26 min. The parameters of TR/Effective TE (eTE)/Echo Train Length (ETL) for T1w and T2w FSE imaging are 750 ms/13 ms/3 and 3000 ms/100 ms/19, respectively. Other parameters for FSE imaging are as follows: FOV=20 cm×20 cm; matrix size=320×260; slices=8; slice thickness=4 mm; bandwidth=244 Hz/Px. Scan time for T1w and T2w imaging were 1:08 and 1:00 min.

The signal intensity of the acquired signal was measured and normalized by the maximum signal in order to compare the measured T1w and T2w signal intensities to Bloch equation simulations. In addition, a similar comparison was made of normalized signal intensity with the proposed method and T1w SGRE and T2w FSE imaging. Linear regression was performed to assess the correlation and agreement between the measured signal, simulated signal, and signal measured using T1w SGRE and T2w FSE imaging.

Volunteer Studies

Healthy volunteers were recruited from an Institutional Review Board (IRB) approved database of healthy volunteers available for volunteer MRI studies of the brain and knee. After providing informed written consent, subjects underwent non-contrast MRI to assess the feasibility of the proposed 3D RF phase modulated GRE method. The acquisition parameters included: TR=5 ms; FA=25°; matrix size=320×256×24; bandwidth=390 Hz/Px; RF phase increment=0.75°; Scan Time=1:02 min. TE/FOV for the brain and knee were 2.3 ms/20 cm×20 cm×12 cm, and 1.55 ms/18 cm×18 cm×9.6 cm, respectively. In addition, conventional T1w FSE and T2w FSE imaging was also performed to serve as reference images. The brain images were acquired using the following parameters: FOV=20 cm×20 cm; matrix size=320×256; slice thickness=5 mm; slice gap=0 mm; slices=24; bandwidth=244 Hz/Px. TR/eTE/ETL for T1w and T2w imaging are 750 ms/13 ms/3, and 3000 ms/100 ms/19, respectively. Scan time for T1w and T2w imaging were 1:17 and 1:06. The parameters for knee imaging include: FOV=18 cm×18 cm; matrix size=320×256; slice thickness=3 mm; slice gap=1 mm; slices=24; bandwidth=195 Hz/Px. TR/eTE/ETL for T1w and T2w imaging are 708 ms/8.5 ms/3, and 3952 ms/68.4 ms/19, respectively. Scan time for T1w and T2w imaging were 1:04 and 1:15 min.

Simulation Results

Figure 8:
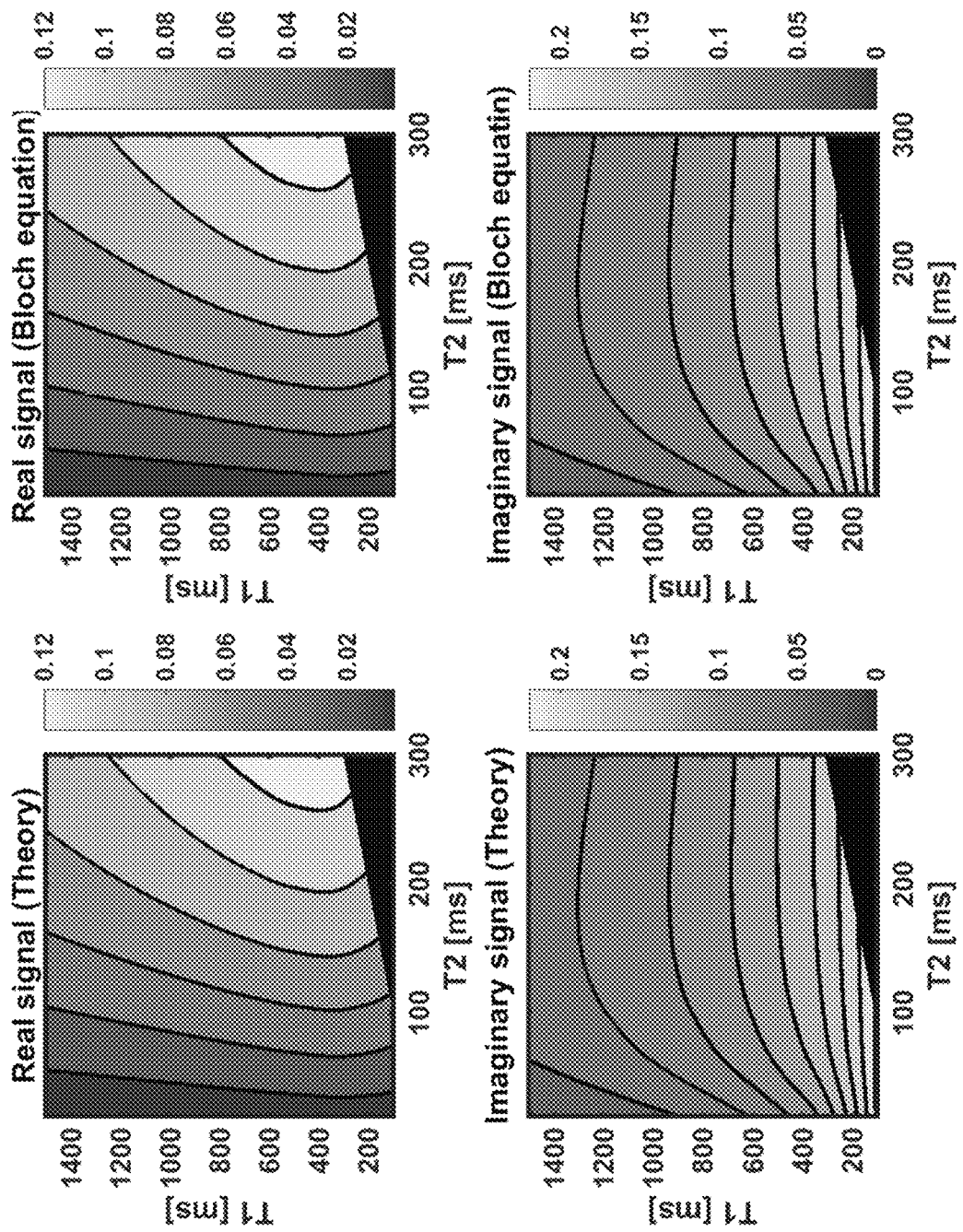
FIG. 8 is a set of correlated graphs showing of real and imaginary signal produced on a theoretical basis and using Bloch equation simulations.

Turning to FIG. 8, plots the real and imaginary signal components for varying T1 and T2 from that predicted by equations 4 and 5 are provided, compared to that predicted by Bloch equation simulations. As shown in FIG. 8, there is excellent agreement between Bloch equation simulations and those predicted in equations 4 and 5 over a wide range of T1 and T2 values, validating the closed form solution in equations 4 and 5.

Figure 9:
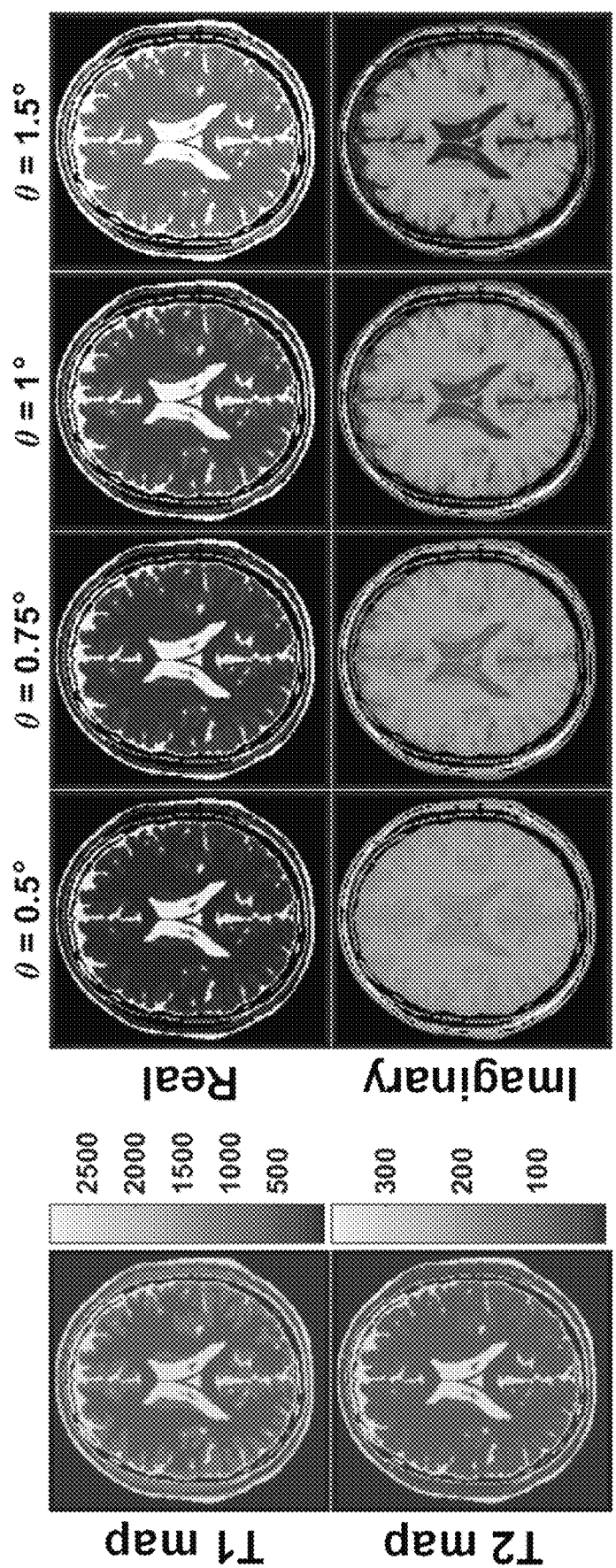
FIG. 9 is a set of correlated images showing a T1 map and a T2 map alongside real and imaginary signals reconstructed into a series of images varying by phase increment, produced using a digital brain phantom.

Referring now to FIG. 9, simulated 3D RF phase modulated GRE images are provided. These images were generated using the digital phantoms. the original T1 and T2 maps from the digital phantom demonstrated that the image contrast can be controlled by changing RF phase increment.

Figure 10:
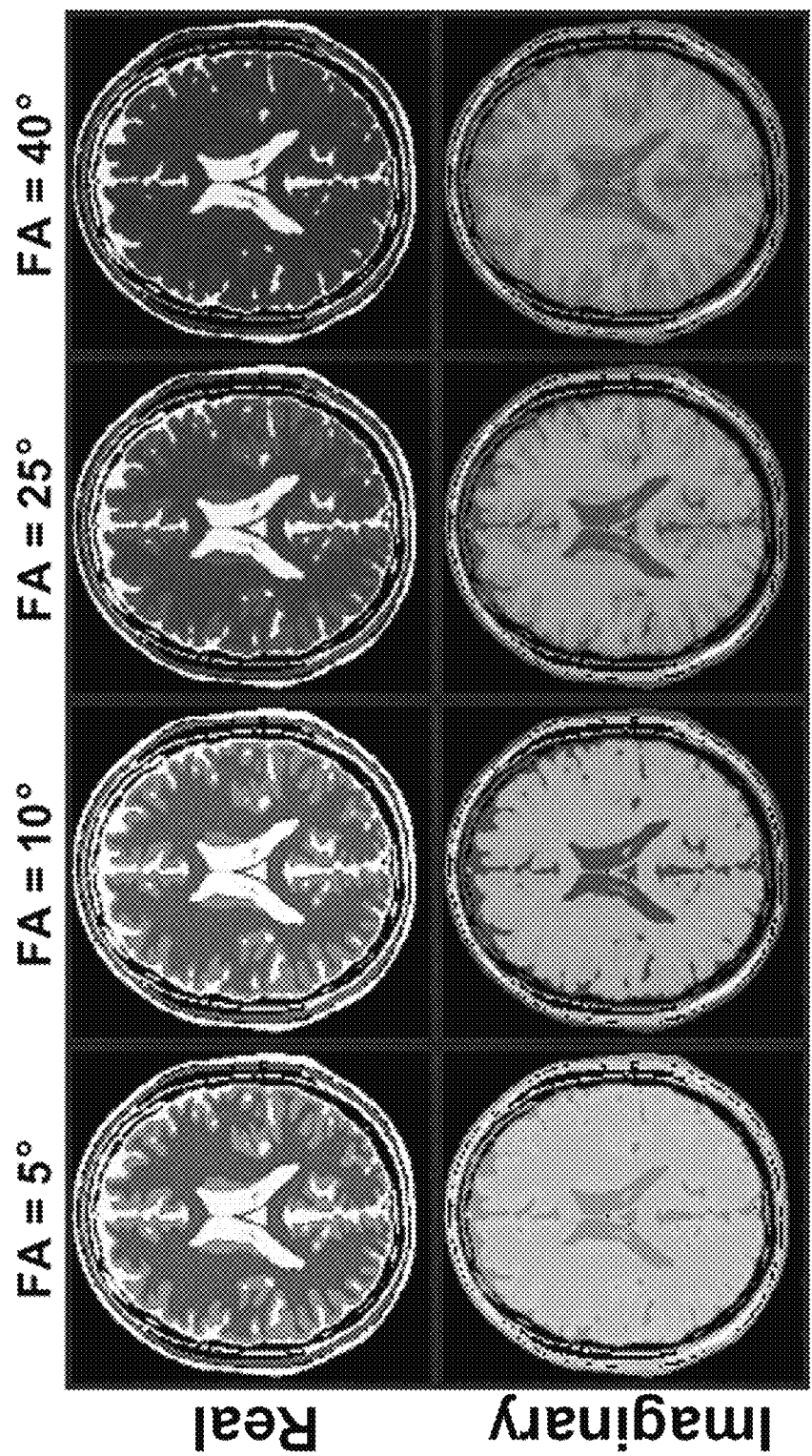
FIG. 10 is a set of correlated images showing real and imaginary components of a digital phantom calculated using methods in accordance with the present invention and variable flip angles and fixed RF phase increment of 1 degree.
Figure 11:
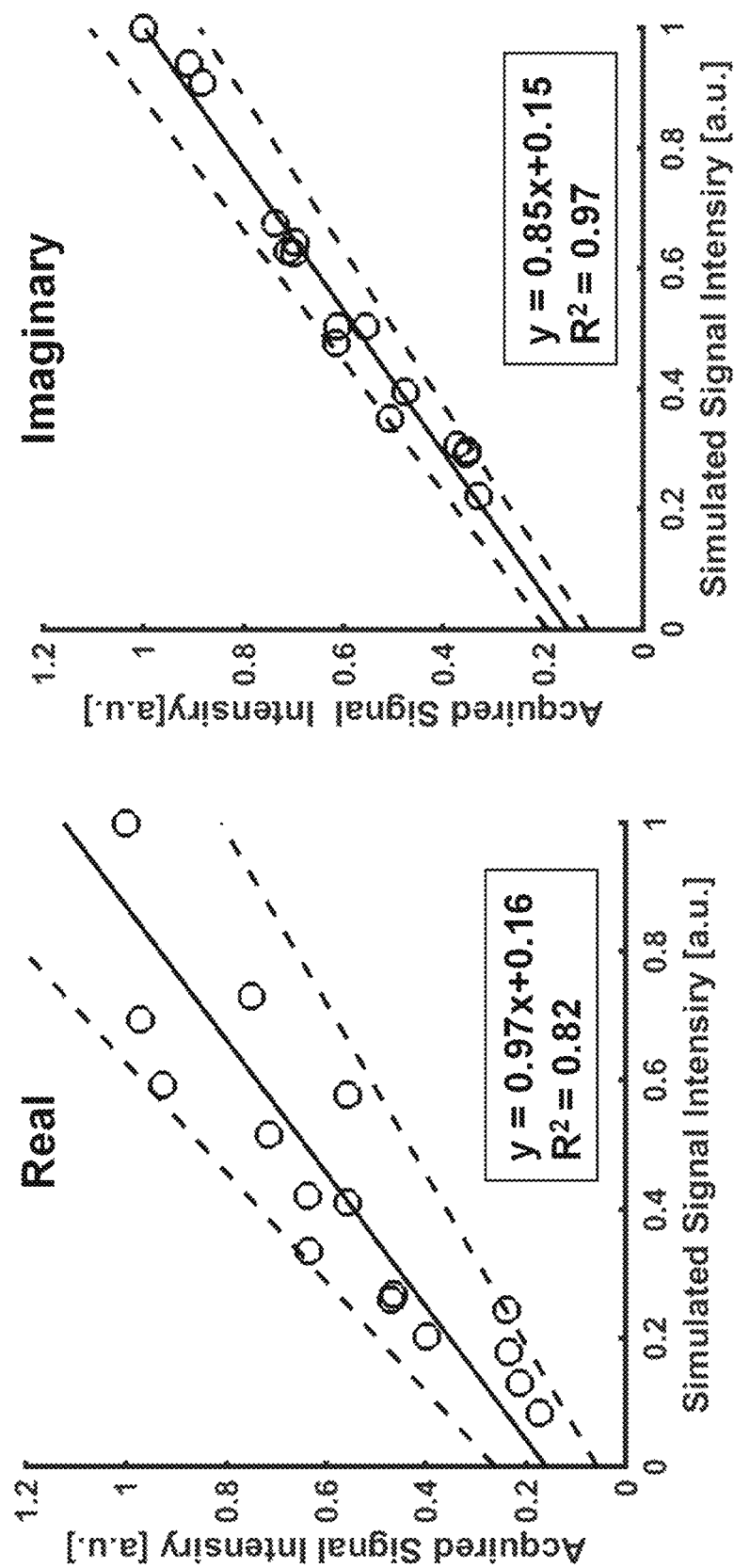
FIG. 11 is a set of correlated graphs of the real and imaginary components of a GRE signal comparing simulated and acquired signal intensities in phantoms.

Referring now to FIG. 10, these images show the calculated images with varying flip angles and fixed RF phase increment of 1°, demonstrating the effects of flip angle on the contrast of both real and imaginary components. Subjectively, the systems and methods of the present disclosure demonstrate T1w and T2w contrast observed at small RF phase increments between white matter, gray matter, and cerebrospinal fluid. As can be seen, as the flip angle increase, T2 contrast becomes stronger in the real component while imaginary components have weaker T1 contrast Phantom Results Referring to FIG. 11, plots are provided from the acquired real and imaginary components of the acquired signal from the phantom acquisition. These are shown in comparison to that predicted by equations 4 and 5. Solid and dashed lines show regression line, and confidence interval, respectively. Both acquired and simulated signal intensities were normalized by the signal in the vial with maximum intensity. Linear regression demonstrates high correlation for real ($R^2$=0.82) and imaginary ($R^2$=0.97) components with a slope of 0.97 (95% confidence interval (CI)=0.75-1.2) and intercept of 0.16 (95% CI=0.054-0.26) for the real component, and slope of 0.85 (95% CI=0.78-0.92) and intercept of 0.15 (95% CI=0.11-0.19) for the imaginary component, demonstrating excellent agreement. Spatially varying B1 sensitivity, which is not considered in the simulation, may contribute to small differences between measured and predicted results.

Figure 12:
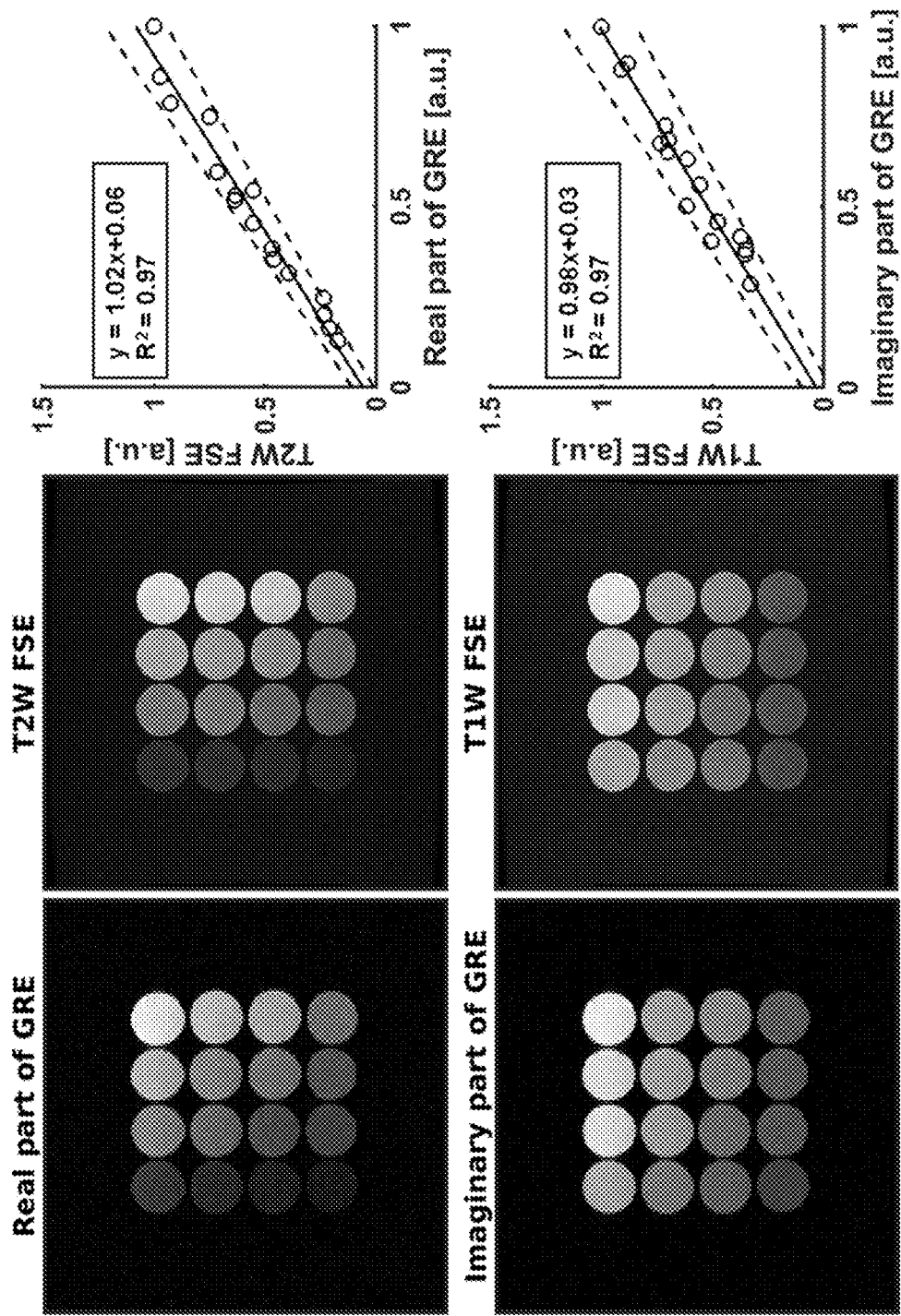
FIG. 12 is a set of phantom images and correlated graphs of the real and imaginary components of images signal acquired using the 3D RF phase modulated GRE sequence of the present disclosure, compared to 2D-FSE acquisition.

Furthermore, FIG. 12 shows phantom images acquired using the above-described techniques using a GRE pulse sequence as compared to images acquired using a FSE pulse sequence. Also provided in FIG. 12 are plots of the normalized signal intensity of the real and imaginary components compared to the T2w and T1w FSE acquisitions, which further demonstrate excellent correlation and agreement. The slopes of the linear regression for T1w and T2w images were 0.98 (95% CI=0.87-1.07) and 1.06 (95% CI=0.93-1.11) while the intercepts for them were 0.03 (95% CI=−0.032-0.095) and 0.06 (95% CI=0.0090-0.11), respectively. Again, the solid and dashed lines in the plots show regression line, and confidence interval, respectively.

Volunteer Results

Figure 13:
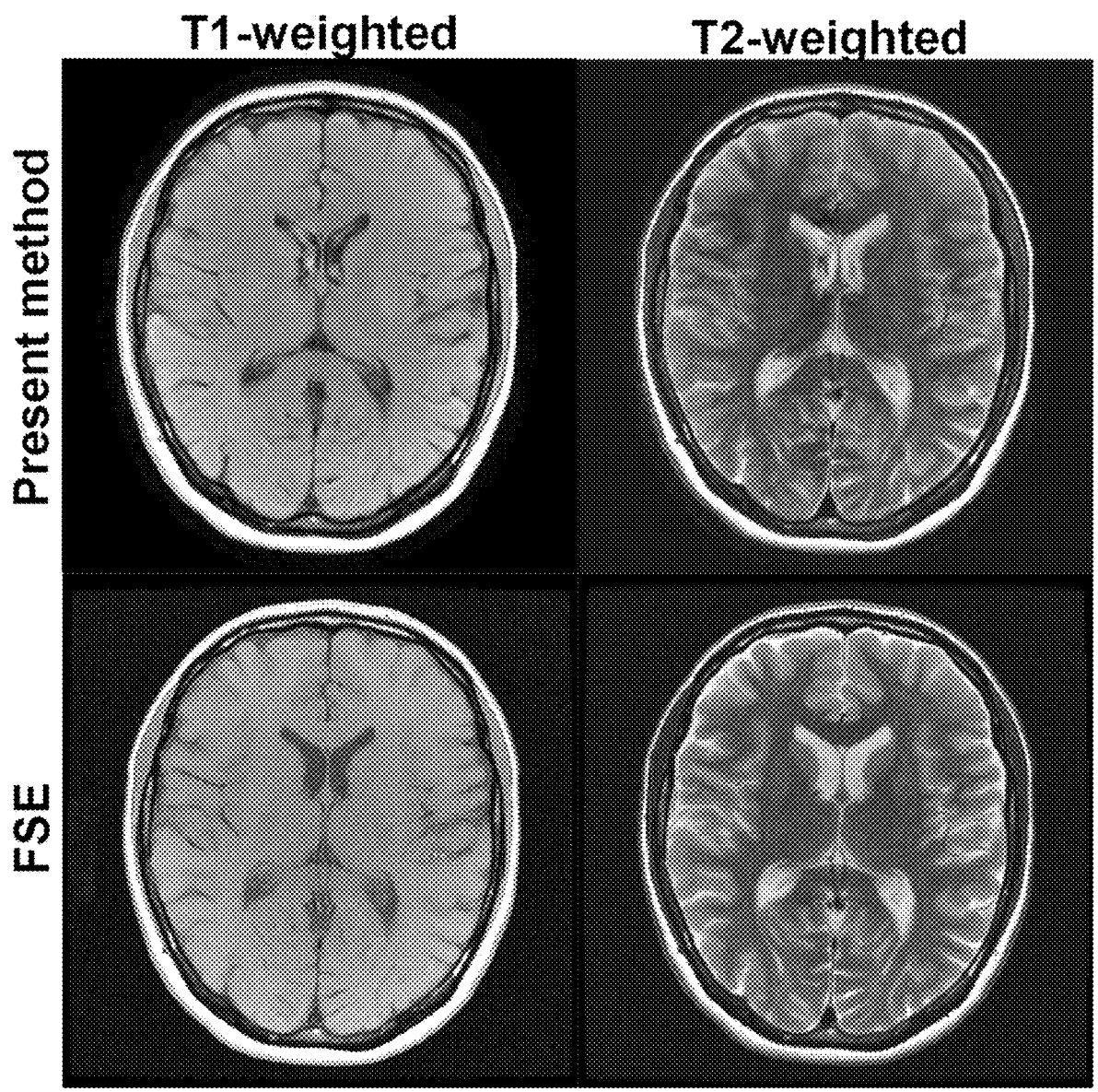
FIG. 13 is a set of correlated images comparing images acquired using the 3D RF phase modulated GRE sequence of the present disclosure, compared to 2D-FSE acquisition.
Figure 14:
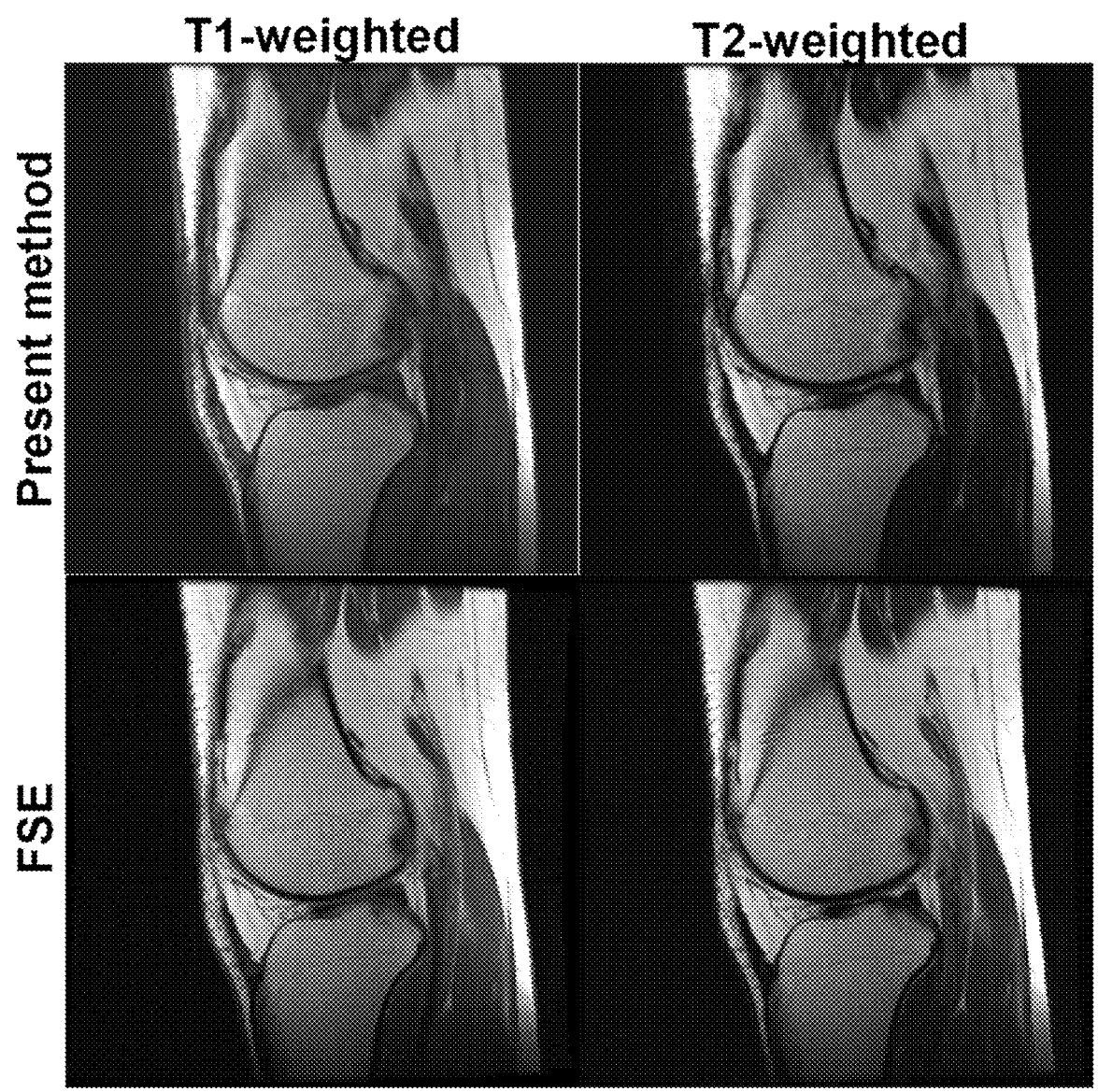
FIG. 14 is another set of correlated images comparing images acquired using the 3D RF phase modulated GRE sequence of the present disclosure, compared to 2D-FSE acquisition.

FIG. 13 is a set of images that show the real and imaginary components of the phase corrected two-pass 3D RF phase modulated images acquired using the above-described methods employing a GRE pulse sequence correlated with conventional 2D T1w and T2w FSE acquisitions. The images of FIG. 13 demonstrate excellent qualitative agreement between the two imaging methods. Notably, the typical contrast observed between grey matter, white matter, and cerebrospinal fluid is observed with both the GRE-based T1w and T2w images produced using the systems and methods of the present disclosure. Excellent image quality was seen in all slices across the entire volume. For T1w imaging, the relative gray-white matter contrast using the systems and methods of the present disclosure were comparable to the FSE-acquired images, which of course carry all the acquisition drawbacks of using an FSE acquisition described above. Notably, time-of-flight inflow effects were noted in cerebral arteries in the more inferior slices, using the proposed T1w (magnitude) component, as might be expected for 3D GRE imaging in the brain. Acquisition time for the images acquired using the systems and methods of the present disclosure was 1:33 only minutes without the use of any parallel imaging as an acceleration technique, while the FSE-based acquisition to acquire both the T1 an T2w images required a total of 2:23 minutes. Thus, the systems and methods of the present disclosure demonstrated comparable, clinically valuable images is substantially less acquisition time than compared to conventional methods using FSE-based acquisitions.

Beyond brain or neurological applications, FIG. 10 shows T1 and T2w images acquired using a traditional FSE-acquisition and a GRE-based acquisition using the systems and methods of the present disclosure, as applied to the knee of a healthy volunteer. Both images demonstrated good image quality. The cartilage signal in T1w and T2w images acquired using the present method agreed qualitatively with those using T1w and T2w FSE. Of course, again, the acquisition time for the GRE-based acquisition using the systems and methods of the present disclosure were again appreciably less than the FSE-based acquisition.

Therefore, the above-described systems and methods for 3D RF phase modulated GRE imaging to obtain simultaneous T1- and T2-weighted images have been demonstrated to provide clinically valuable images with substantially less acquisition times than prior-art methods. In one configuration, these images are created by using an RF phase modulated strategy that acquires 3D GRE images with a selected RF phase increment. Both Bloch equation simulations and closed form equations demonstrate that the phase imparted into the signal results in separable T1w and T2w signals in the real and imaginary components of the complex signal. By performing an optional two-pass strategy with reversal of the RF phase increment, background phase shifts can also be removed. The systems and methods have been demonstrated to provide clinically feasible results in simulations and phantoms, demonstrating excellent agreement with both theory and conventional T1 and T2w imaging, as well as good qualitative agreement using both anatomical digital phantoms and in vivo in healthy volunteers.

Thus, the systems and methods provided herein offer an alternative approach to the acquisition of acquisition of sequentially acquired T1w and T2w imaging, for example using FSE-based acquisitions, while doing so with substantially reduced acquisition times. Substantially reduced acquisition times are advantageous for rapid or focused MRI protocols that require both contrast mechanisms as part of the standard examination. Past strategies with GRE imaging using partial RF-spoiling have been proposed to obtain various contrast mechanisms and quantitative maps. These techniques have focused on the magnitude of the RF-spoiled GRE acquisitions including heavy T2 like contrast and CSF-suppressed imaging by Ganter C. Steady state of gradient echo sequences with radiofrequency phase cycling: Analytical solution, contrast enhancement with partial spoiling. Magnetic Resonance in Medicine 2006; 55W:98-107, which is incorporated herein by reference. Further, Bieri O, Scheffler K, Welsch G H, Trattnig S, Mamisch T C, Ganter C. Quantitative Mapping of T-2 Using Partial Spoiling. Magnetic Resonance in Medicine 2011; 66(2):410-418 have also used partial RF spoiling strategies to perform T2 mapping, using the magnitude of the RF spoiled GRE acquisition, which is also incorporated herein by reference. However, unlike these past techniques, the systems and methods of the present disclosure provide both T1w and T2w imaging in the same acquisition, thereby reducing the overall acquisition time, as well as providing perfectly co-registered T1w and T2w images, which are not provided by the above-cited techniques. In addition, the use of 3D acquisitions facilitates 2D parallel imaging acceleration, allowing for further reductions in overall scan time.

When the RF phase modulated GRE acquisitions are obtained in the steady state, magnetization preparation strategies such as fat saturation pulses and inversion recovery pulses may not be compatible with this strategy. However, the use of multi-point Dixon strategies, however, are fully compatible with this approach. Thus, the systems and methods of the present disclosure can be used with fat suppression through such chemical-shift-encoded, fat-water separation strategies.

As described above, it is possible to utilize a two-pass acquisition to reduce or remove background phase effects. Notably, a separate second pass is not required, or is an additional pass necessarily a doubling of the scan time. For example, should calibration scans be available, for example, when using a parallel acquisition, the calibration scans can be used to provide estimates of the background phase. In this case, the systems and methods provided herein, even when including the removal of the background phase, can be contained to a single acquisition. As the two passes are identical in every regard, except for the sign of the RF phase increment, complications such as variations in signal intensity between the two passes should not impact this strategy in any negative manner.

In theory, the presence of very short T2* signal within the tissue could potentially impact the proposed separation of T1w and T2w signal components. However, by maintaining sufficient signal to noise ratio (SNR), the presence of T2* decay does not impact the phase measurement. Thus, the systems and methods provided herein are substantially insensitive to T2* signal decay.

Finally, the systems and methods described herein can be combined, as mentioned, with parallel imaging and multipoint Dixon strategies, but also compressed sensing, parallel imaging and other acceleration or reconstruction techniques.

Thus, the present disclosure provides systems and methods employing an RF phase modulated GRE acquisition for simultaneous 3D T1w and T2w imaging yielding co-registered and simultaneous T1w and T2w images.

The present invention has been described in terms of one or more preferred embodiments, and it should be appreciated that many equivalents, alternatives, variations, and modifications, aside from those expressly stated, are possible and within the scope of the invention.

The invention claimed is:

1. A magnetic resonance imaging (MRI) system comprising:
 a magnet system configured to generate a polarizing magnetic field about at least a portion of a subject arranged in the MRI system;
 a plurality of gradient coils configured to apply magnetic gradients to the polarizing magnetic field;

a radio frequency (RF) system configured to apply an excitation field to the subject and acquire MR image data from the subject;

a computer system programmed to:

control the plurality of gradient coils and the RF system to perform a gradient echo pulse sequence that includes a phase increment of an RF pulse of the gradient echo pulse sequence selected to encode longitudinal relaxation (T1) information in an imaginary component of a magnetic resonance (MR) data received from the subject and encode at least transverse relaxation (T2) information in a real component of the MR data received from the subject;

process the MR data to determine the T1 information from the imaginary component of the MR data and determine the T2 information from the real component of the MR data;

generate at least one of an image or a map of the subject reflecting at least one of T1 weighting or a T2 weighting; and a display configured to display the at least one image or map of the subject reflecting at least one of T1 weighting or the T2 weighting.

2. The MRI system of claim 1, wherein the computer system is configured use further MR data acquired from the subject with the phase increment being equal in magnitude but opposite in sign to subtract from the MR data to remove background phase from the MR data before generating the at least one of the image or the map of the subject.

3. The MRI system of claim 2, wherein the computer system is further configured to acquire the further MR data by performing a second performance of the gradient echo pulse sequence, a navigator acquisition, or a calibration scan.

4. The MRI system of claim 1, wherein the phase increment is 32.2 degrees or less than 25 degrees.

5. The MRI system of claim 1, wherein the phase increment is less than 3 degrees.

6. The MRI system of claim 1, wherein the phase increment is less than 2 degrees.

7. The MRI system of claim 1, wherein the T1 information and the T2 information are simultaneously acquired.

8. The MRI system of claim 1, wherein the at least one image or map includes a T1 image or map and a T2 image or map that are co-registered.

9. A method for producing at least one of an image or a map of a subject comprising:

controlling a magnetic resonance imaging system to perform a pulse sequence that includes at least one phase increment of an RF pulse of a gradient echo pulse sequence configured to encode longitudinal relaxation (T1) information in an imaginary component of a magnetic resonance (MR) data received from the subject and encode at least transverse relaxation (T2) information in a real component of the MR data received from the subject;

generating at least one image or map of the subject from the MR data; and displaying the at least one image or map of the subject.

10. The method of claim 9, further comprising processing the MR data to determine the T1 information from the imaginary component of the MR data and determine the T2 information from the real component of the MR data.

11. The method of claim 10, wherein the real component is given by:

$$\mathrm{Re}(S) = \beta \eta e^{\frac{TR}{T2}};$$

and the imaginary component given by:

$$\mathrm{Im}(S) = \beta \left[ \eta^2 - \in \left( e^{-\frac{TR}{T2}} - \in \right) \right];$$

with:

$$\beta = \frac{\left(1 - e^{-\frac{TR}{T2}}\right) M_0 \sin\alpha}{\left(e^{-\frac{TR}{T2}} - \in\right)\left[e^{-\frac{TR}{T2}}\left(\cos\alpha - e^{-\frac{TR}{T1}}\right) + \in\left(1 - e^{-\frac{TR}{T1}}\cos\alpha\right)\right] - \eta^2\left(1 - e^{-\frac{TR}{T1}}\cos\alpha\right)};$$

where $M_0$ is a proton density, and $\in$ and $\eta$ are real coefficients defined as:

$$\in = \mathrm{Re}\left(\frac{\lambda - \Omega_{22}}{\Omega_{21}}\right) \text{ and } \eta = \mathrm{Im}\left(\frac{\lambda - \Omega_{22}}{\Omega_{21}}\right);$$

with:

$$\lambda = \frac{2}{\Omega_{11} + \Omega_{22} + \sqrt{(\Omega_{11} + \Omega_{22})^2 - 4}};$$

where $\lambda$, $\in$, and $\eta$ can be determined from the diagonal elements, $\Omega_{11}$ and $\Omega_{22}$, of a recursive matrix equation given by $$\begin{bmatrix} \Omega_{11} & \Omega_{21} \\ \Omega_{21} & \Omega_{22} \end{bmatrix} = \Psi_L \Psi_{L-1} \ldots \Psi_1;$$

with the matrix $\Psi_l$ defined as:

$$\Psi_l = \frac{1}{(1 + \cos\alpha)\left(1 - e^{-\frac{TR}{T1}} e^{j\theta l}\right)} \cdot \qquad \text{Eqn. 10}$$

$$\begin{bmatrix} 2e^{-\frac{TR}{T2}} \cdot \left(\cos\alpha - e^{-\frac{TR}{T1}} e^{j\theta l}\right) & (1 - \cos\alpha)\left(1 + e^{-\frac{TR}{T1}} e^{j\theta l}\right) \cdot e^{-j\theta l^2} \\ -(1 - \cos\alpha)\left(1 + e^{-\frac{TR}{T1}} e^{j\theta l}\right) e^{j\theta l^2} & 2e^{\frac{TR}{T2}}\left(1 - e^{-\frac{TR}{T1}} \cos\alpha \cdot e^{j\theta l}\right) \end{bmatrix}$$

where l=1, ..., L, and where L and N is an integer determined to satisfy the following condition:

$$\frac{\theta}{2} \cdot L = N \cdot \pi$$

(N=0, 1, 2, 3, ...).

12. The method of claim 9, further comprising acquiring further MR data from the subject with a further phase increment being equal in magnitude but opposite in sign to the phase increment to subtract from the MR data to remove background phase from the MR data before generating the at least one image or map of the subject.

13. The method of claim 12, further comprising acquiring the further MR data by performing a second performance of the gradient echo pulse sequence, a navigator acquisition, or a calibration scan.

14. The method of claim 9, wherein the phase increment is 32.2 degrees or less than 25 degrees.

15. The method of claim 9, wherein the phase increment is less than 3 degrees.

16. The method of claim 9, wherein the phase increment is less than 2 degrees.

17. The method of claim 9, wherein the T1 information and the T2 information are simultaneously acquired.

18. The method of claim 9, wherein the at least one image or map includes a T1 image or map and a T2 image or map that are co-registered.

19. The method of claim 9, further comprising performing a fat suppression using the MR data using chemical-shift-encoded, fat-water separation strategy.

* * * * *

UNITED STATES PATENT AND TRADEMARK OFFICE
CERTIFICATE OF CORRECTION

| | |
|---|---|
| PATENT NO. | : 11,287,501 B1 |
| APPLICATION NO. | : 17/184768 |
| DATED | : March 29, 2022 |
| INVENTOR(S) | : Daiki Tamada |

It is certified that error appears in the above-identified patent and that said Letters Patent is hereby corrected as shown below:

In the Specification

Column 16, Line 2, "55W:98-107" should be --55(1):98-107--.

Signed and Sealed this
Twenty-fourth Day of May, 2022

Katherine Kelly Vidal
*Director of the United States Patent and Trademark Office*